United States Patent
Washio et al.

(10) Patent No.: US 10,833,293 B2
(45) Date of Patent: Nov. 10, 2020

(54) DISPLAY APPARATUS AND METHOD OF MANUFACTURING THE SAME

(71) Applicant: THE JAPAN STEEL WORKS, LTD., Tokyo (JP)

(72) Inventors: Keisuke Washio, Kanagawa (JP); Tatsuya Matsumoto, Kanagawa (JP); Takashi Ebisawa, Kanagawa (JP); Junichi Shida, Kanagawa (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 0 days.

(21) Appl. No.: 16/490,541

(22) PCT Filed: Oct. 31, 2017

(86) PCT No.: PCT/JP2017/039428
§ 371 (c)(1),
(2) Date: Aug. 31, 2019

(87) PCT Pub. No.: WO2018/163503
PCT Pub. Date: Sep. 13, 2018

(65) Prior Publication Data
US 2020/0006706 A1 Jan. 2, 2020

(30) Foreign Application Priority Data
Mar. 6, 2017 (JP) ................. 2017-041318

(51) Int. Cl.
*H01L 27/32* (2006.01)
*H01L 51/52* (2006.01)
(Continued)

(52) U.S. Cl.
CPC ........ *H01L 51/5256* (2013.01); *C23C 16/303* (2013.01); *C23C 16/308* (2013.01);
(Continued)

(58) Field of Classification Search
None
See application file for complete search history.

(56) References Cited

U.S. PATENT DOCUMENTS

| 2001/0031379 A1 | 10/2001 | Tera et al. |
| 2007/0164666 A1 | 7/2007 | Oosono et al. |

(Continued)

FOREIGN PATENT DOCUMENTS

| JP | 2001-284042 A | 10/2001 |
| JP | 2004-063304 A | 2/2004 |

(Continued)

OTHER PUBLICATIONS

International Search Report from International Patent Application No. PCT/JP2017/039428, dated Feb. 6, 2018.
(Continued)

*Primary Examiner* — Minh Loan Tran
(74) *Attorney, Agent, or Firm* — SGPatents PLLC

(57) ABSTRACT

A method of manufacturing a display apparatus having an organic EL element includes: a step of forming the organic EL element over a substrate made of a flexible substrate; and a step of forming a protecting film 16 made of an inorganic insulating material so as to cover the organic EL element by using an ALD method. In the step of forming the protecting film 16, the protecting film 16 is formed by alternately performing a step of forming a high-density layer 16H by using an ALD method and a step of forming, by using an ALD method, a low-density layer 16L that has the same constituent element as the high-density layer 16H and has a lower density than the high-density layer 16H. The protecting film 16 has a layered structure made of one or more high-density layers 16H and one or more low-density layers
(Continued)

16L so that the low-density layer 16L and the high-density layer 16H are alternately layered so as to be in contact with each other.

20 Claims, 15 Drawing Sheets

(51) Int. Cl.
    *C23C 16/30*     (2006.01)
    *C23C 16/40*     (2006.01)
    *C23C 16/455*    (2006.01)
    *H01L 51/00*     (2006.01)
    *H01L 51/56*     (2006.01)

(52) U.S. Cl.
    CPC ...... *C23C 16/403* (2013.01); *C23C 16/45525* (2013.01); *H01L 27/32* (2013.01); *H01L 27/3223* (2013.01); *H01L 27/3241* (2013.01); *H01L 27/3244* (2013.01); *H01L 27/3246* (2013.01); *H01L 51/0097* (2013.01); *H01L 51/56* (2013.01); *H01L 51/5253* (2013.01); *H01L 2251/301* (2013.01); *H01L 2251/303* (2013.01)

(56) References Cited

U.S. PATENT DOCUMENTS

| | | |
|---|---|---|
| 2009/0309486 A1 | 12/2009 | Imai et al. |
| 2010/0178481 A1 | 7/2010 | George et al. |
| 2010/0193955 A1 | 8/2010 | Milligan et al. |
| 2011/0234088 A1* | 9/2011 | Abe .................... G02B 5/0215 |
| | | 313/504 |
| 2012/0132953 A1 | 5/2012 | Becker et al. |
| 2012/0280614 A1 | 11/2012 | Imai et al. |
| 2014/0008803 A1 | 1/2014 | Milligan et al. |

FOREIGN PATENT DOCUMENTS

| | | |
|---|---|---|
| JP | 2007-184251 A | 7/2007 |
| JP | 2007-220646 A | 8/2007 |
| JP | 2012-517101 A | 7/2012 |
| JP | 2012-521623 A | 9/2012 |
| JP | 5220106 B2 | 6/2013 |
| JP | 2014-127323 A | 7/2014 |

OTHER PUBLICATIONS

Office Action dated Jun. 23, 2020, in Japanese Patent Application No. 2017-041318.

* cited by examiner

DISPLAY APPARATUS AND METHOD OF MANUFACTURING THE SAME

TECHNICAL FIELD

The present invention relates to a display apparatus and a method of manufacturing the same, and can be preferably utilized for, for example, an organic EL display apparatus and a method of manufacturing the same.

BACKGROUND ART

Development of an organic electroluminescence element (organic electroluminescence device) utilizing electroluminescence as a light emitting element has advanced. Note that the organic electroluminescence element is called an organic EL element. The electroluminescence is a phenomenon in which light emission is caused when a voltage is applied to a substance. Particularly, an element in which the electroluminescence is caused on an organic substance is called an organic EL element (organic electroluminescence element). The organic EL element is a current-injection type device, and has diode characteristics, and therefore, is also called an organic light emitting diode (OLED).

Japanese Patent Application Laid-Open Publication No. 2007-184251 (Patent Document 1) describes a technique related to a display apparatus formed by covering an organic electric-field light emitting element with a protecting film. Japanese Paten No. 5220106 (Patent Document 2) describes a technique related to a protecting film for use in an organic electronic device.

RELATED ART DOCUMENTS

Patent Documents

Patent Document 1: Japanese Patent Application Laid-Open Publication No. 2007-184251
Patent Document 2: Japanese Paten No. 5220106

SUMMARY OF THE INVENTION

Problems to be Solved by the Invention

An organic EL element is weak against water, and therefore, it is desirable to form a protecting film so as to cover an organic EL element to prevent transmission of the water to the organic EL element. Thus, also in a display apparatus using the organic EL element, it is desirable to use a protecting film and improve reliability of the protecting film.

Other objects and novel characteristics will be apparent from the description of the present specification and the accompanying drawings.

Means for Solving the Problems

According to one embodiment, a display apparatus includes: a flexible substrate; an organic EL element formed over the flexible substrate; and a protecting film made of an inorganic insulating material formed so as to cover the organic EL element. The protecting film has a layered structure made of one or more high-density layers and one or more low-density layers having a lower density than that of the high-density layer so that the low-density layer and the high-density layer are alternately layered so as to be in contact with each other. The one or more high-density layers and the one or more low-density layers configuring the protecting film have the same constituent element as each other.

According to one embodiment, a method of manufacturing a display apparatus includes: (a) a step of forming an organic EL element over a flexible substrate; and (b) a step of forming a protecting film made of an inorganic insulating material so as to cover the organic EL element by using an ALD method. In the step (b), the protecting film is formed by alternately performing (c) a step of forming ta high-density layer by using an ALD method and (d) a step of forming, by using an ALD method, a low-density layer having the same constituent element as the high-density layer and having a lower density than the high-density layer before or after the step (c). The protecting film has a layered structure made of the one or more high-density layers and the one or more low-density layers so that the low-density layer and the high-density layer are alternately layered so as to be in contact with each other.

Effects of the Invention

According to one embodiment, reliability of a protecting film of a display apparatus can be improved.

BRIEF DESCRIPTIONS OF THE DRAWINGS

BEST MODE FOR CARRYING OUT THE INVENTION

Hereinafter, embodiments will be described in detail on the basis of the accompanying drawings. Note that components having the same function are denoted by the same reference symbol throughout all the drawings for describing the embodiments, and the repetitive description thereof will be omitted. In the following embodiments, the description of the same or similar parts will be not repeated in principle unless otherwise particularly required.

Embodiment

<Regarding Entire Structure of Display Apparatus>

A display apparatus of the present embodiment is an organic EL display apparatus (organic electroluminescence display apparatus) using an organic EL element. The display apparatus of the present embodiment will be described with reference to the drawings.

Figure 1:
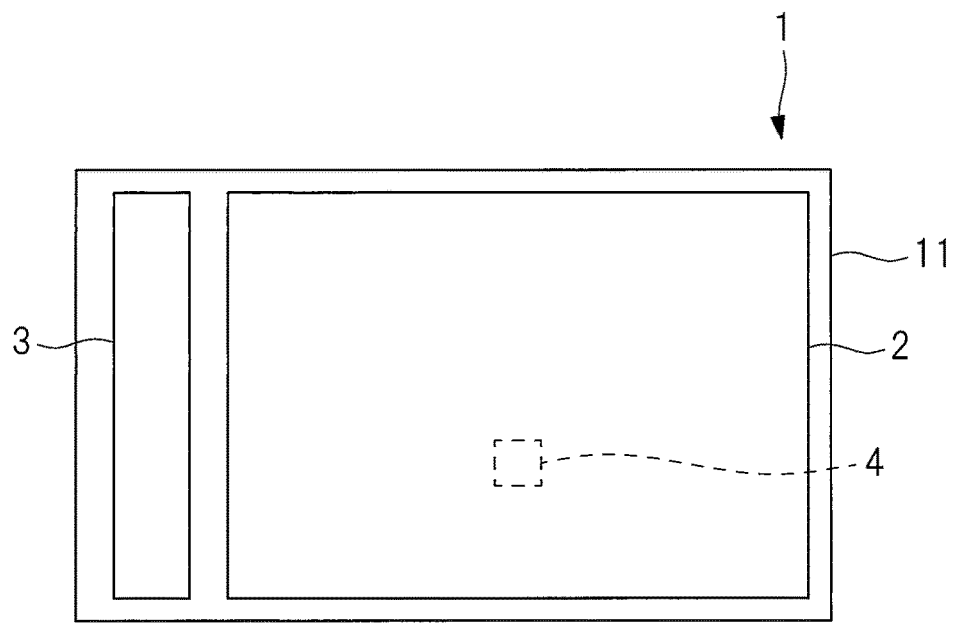
FIG. 1 is a plan view showing an entire configuration of a display apparatus of one embodiment.

FIG. 1 is a plan view showing an entire configuration of a display apparatus 1 of the present embodiment.

The display apparatus 1 shown in FIG. 1 includes a display unit 2 and a circuit unit 3. In the display unit 2, a plurality of pixels are arranged in an array form so that images can be displayed. Various circuits are formed in the circuit unit 3 if needed, and the circuits such as a driving circuit and a controlling circuit are formed. The circuits in the circuit unit 3 are connected to the pixels of the display unit 2 if needed. The circuit unit 3 may be also out of the display apparatus 1. As a planar shape of the display apparatus 1, various shapes are applicable, and, for example, a rectangular shape is applied.

Figure 2:
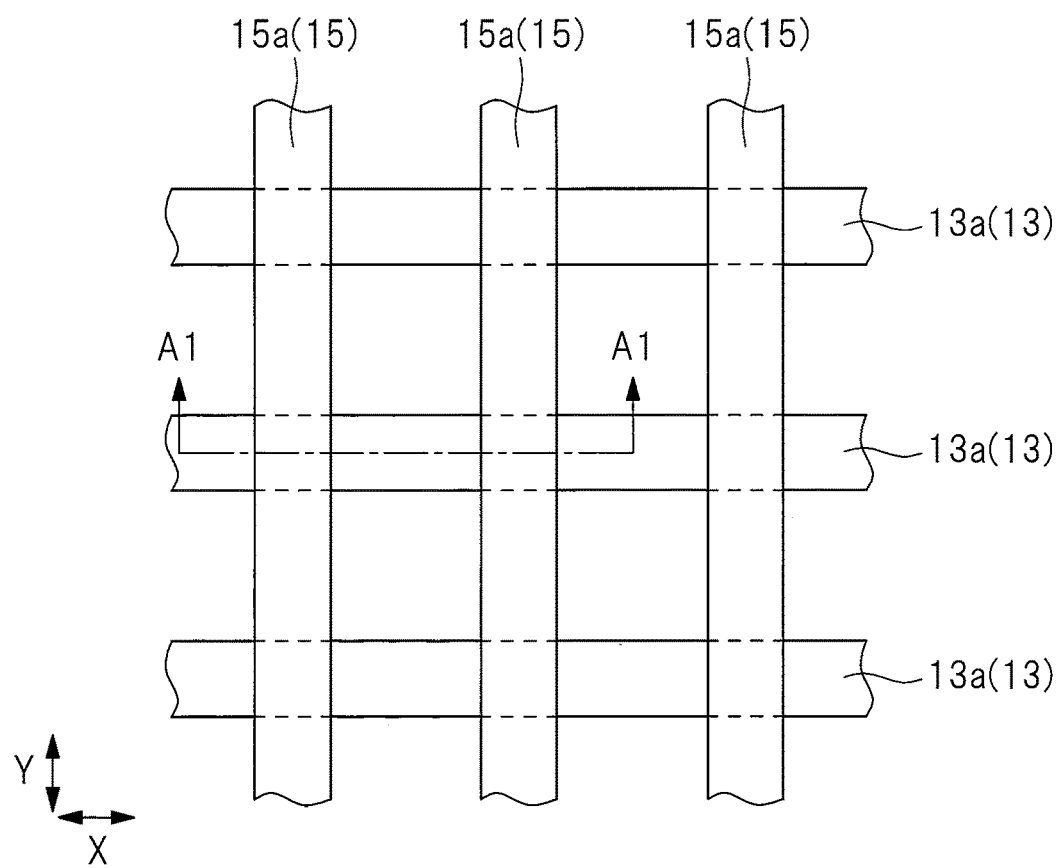
FIG. 2 is a plan view of a principal part of the display apparatus of one embodiment.
Figure 3:
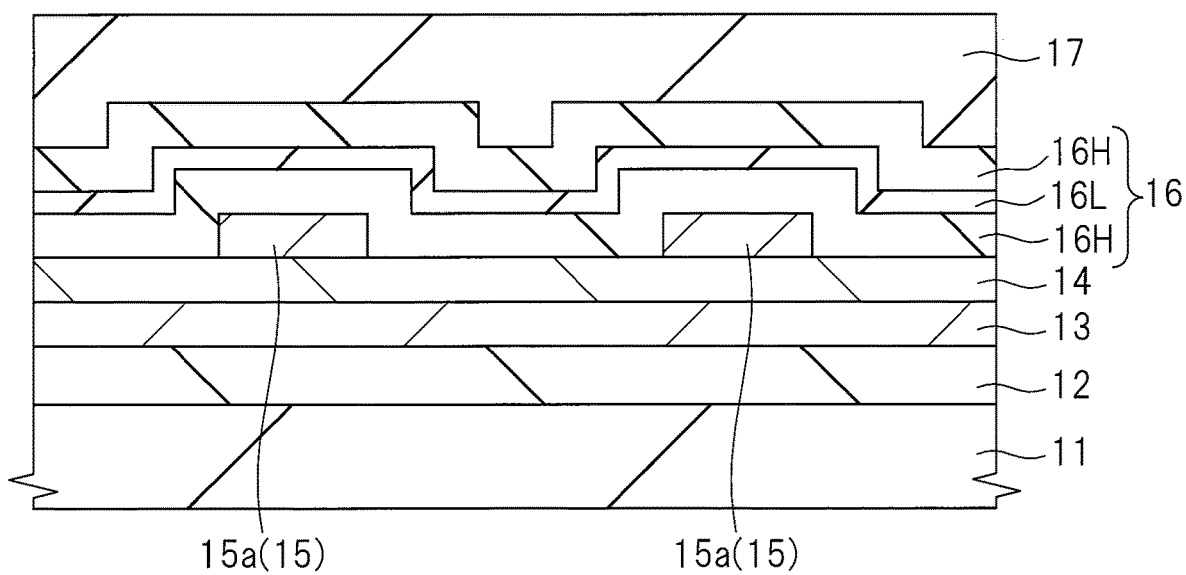
FIG. 3 is a cross-sectional view of a principal part of the display apparatus of one embodiment.

FIG. 2 is a plan view of a principal part of the display apparatus 1, and FIG. 3 is a cross-sectional view of a principal part of the display apparatus 1. In FIG. 2, a part (a region 4 shown in FIG. 1) of the display unit 2 of the display apparatus 1 is illustrated to be enlarged. FIG. 3 nearly corresponds to a cross-sectional view of FIG. 2 at a position of a line A1-A1.

A substrate 11 configuring a base of the display apparatus 1 has an insulating property. The substrate 11 is a flexible substrate (film substrate), and has flexibility. Therefore, the substrate 11 is a flexible substrate having an insulating property, that is, a flexible insulating substrate. The substrate 11 may also have light transparent property. As the substrate 11, for example, a film-like plastic substrate (plastic film) can be used. The substrate 11 exists over an entire planar surface of the display apparatus 1 of FIG. 1, and configures the lowermost layer of the display apparatus 1. Therefore, the planar shape of the substrate 11 is nearly the same as a planar shape of the display apparatus 1, various shapes are applicable, and, for example, a rectangular shape is applicable. Note that a principal surface where the organic EL element is arranged among two principal surfaces of the substrate 11 that are positioned to be opposite to each other, in other words, the principal surface where later-described passivation film 12, electrode layer 13, organic layer 14, electrode layer 15 and protecting film 16 are formed, is assumed to be an upper surface of the substrate 11. The principal surface opposite to the upper surface of the substrate 11 is assumed to be a lower surface of the substrate 11.

Over the upper surface of the substrate 11, the passivation film (passivation layer) 12 is formed. The passivation film 12 is made of an insulating material (insulating film) such as a silicon oxide film. Although the passivation film 12 may not be formed, it is more preferable to form the passivation film 12. The passivation film 12 can be formed almost over the entire upper surface of the substrate 11.

The passivation film 12 has a function capable of preventing (blocking) transmission of water from the substrate 11 to the organic EL element (particularly the organic layer 14). Therefore, the passivation film 12 can function as a lower protecting film of the organic EL element. On the other hand, the protecting film 16 can function as an upper protecting film of the organic EL element, and has a function capable of preventing (blocking) transmission of water from above to the organic EL element (particularly the organic layer 14).

The organic EL element is formed over the upper surface of the substrate 11 through the passivation film 12. The organic EL element is made of the electrode layer 13, the organic layer 14 and the electrode layer 15. That is, the electrode layer 13, the organic layer 14 and the electrode layer 15 are formed (layered) over the passivation film 12 over the substrate 11 in this order from below upward, and the organic EL element is made of the electrode layer 13, the organic layer 14 and the electrode layer 15.

The electrode layer 13 is a lower electrode layer, and the electrode layer 15 is an upper electrode layer. The electrode layer 13 configures one of an anode and a cathode while the electrode layer 15 configures the other of the anode and the cathode. That is, when the electrode layer 13 is the anode (anode layer), the electrode layer 15 is the cathode (cathode layer). When the electrode layer 13 is the cathode (cathode layer), the electrode layer 15 is the anode (anode layer). Each of the electrode layer 13 and the electrode layer 15 is made of a conductive film.

One of the electrode layer 13 and the electrode layer 15 is preferably made of a metal film such as an aluminum (Al) film so that the electrode layer can function as a reflector electrode. The other of the electrode layer 13 and the electrode layer 15 is preferably made of a transparent conductive film made of ITO (indium tin oxide) film so that the electrode layer can function as a transparent electrode. When a method of extracting light from the lower surface side of the substrate 11, that is, a bottom emission method is applied, the electrode layer 13 can be used as the transparent electrode. When a method of extracting light from the upper surface side of the substrate 11, that is, a top emission method is applied, the electrode layer 15 can be used as the transparent electrode. When the bottom emission method is applied, a transparent substrate (transparent flexible substrate) having the light transparent property can be used as the substrate 11.

The electrode layer 13 is formed over the passivation film 12 over the substrate 11, the organic layer 14 is formed over the electrode layer 13, and the electrode layer 15 is formed over the organic layer 14. Therefore, the organic layer 14 intermediates between the electrode layer 13 and the electrode layer 15.

The organic layer 14 includes at least an organic luminescence layer. In addition to the organic luminescence layer, the organic layer 14 may further include any layer of a hole carrier layer, a hole injection layer, an electronic carrier layer, and an electronic injection layer if needed. Therefore, the organic layer 14 may have, for example, a single-layer structure made of the organic luminescence layer, a layered structure made of the hole carrier layer, the organic luminescence layer and the electronic carrier layer, a layered structure made of the hole carrier layer, the hole injection layer, the organic luminescence layer, the electronic carrier layer, and the electronic injection layer, or others.

The electrode layer 13 has, for example, a stripe-form pattern extending in an X direction. That is, the electrode layer 13 has a configuration in which a plurality of line-form electrodes (electrode patterns) 13a extending in the X direction are arranged so as to put a predetermined interval therebetween in a Y direction. The electrode layer 15 has, for example, a stripe-form pattern extending in the Y direction. That is, the electrode layer 15 has a configuration in which a plurality of line-form electrodes (electrode patterns) 15a extending in the Y direction are arranged so as to put a predetermined interval therebetween in the X direction. That is, the electrode layer 13 is made of the stripe-form electrode group extending in the X direction while the electrode layer 15 is made of the stripe-form electrode group extending in the Y direction. In this case, the X direction and the Y direction are directions that cross each other, and, more specifically, that are orthogonal to each other. The X direction and the Y direction are also directions substantially in parallel to the upper surface of the substrate 11.

The extending direction of each electrode 15a configuring the electrode layer 15 is the Y direction while the extending direction of each electrode 13a configuring the electrode layer 13 is the X direction, and therefore, the electrode 15a and the electrode 13a cross each other in a plan view. Note that the plan view means a viewing case of a plan surface substantially in parallel to the upper surface of the substrate 11. Each cross point between the electrodes 15a and the electrodes 13a has a structure in which the organic layer 14 is sandwiched by the electrode 15a and the electrode 13a from above and below. Therefore, at each cross point between the electrode 15a and the electrode 13a, an organic EL element (organic EL element configuring a pixel) made of the electrode 15a, the electrode 13a, and the organic layer 14 between the electrodes 13a and 15a is formed, and the pixel is made of the organic EL element. When a predetermined voltage is applied between the electrode 15a and the electrode 13a, an organic luminescence layer in the organic layer 14 at a point sandwiched by the electrode 15a and the electrode 13a can emit light. That is, the organic EL element configuring each pixel can emit the light. The electrode 15a functions as the upper electrode (one of the anode and the cathode) of the organic EL element while the electrode 13a functions as the lower electrode (the other of the anode and the cathode) of the organic EL element.

Note that the organic layer 14 can be formed over the entire display unit 2, but can be also formed as the same pattern as that of the electrode layer 13 (that is, the same patterns as those of the plurality of electrodes 13a configuring the electrode layer 13) or the same pattern as that of the electrode layer 15 (that is, the same patterns as those of the plurality of electrodes 15a configuring the electrode layer 15). In either case, the organic layer 14 exists at each cross point between the plurality of electrodes 13a configuring the electrode layer 13 and the plurality of electrodes 15a configuring the electrode layer 15.

As described above, in a plan view, a plurality of organic EL elements (pixels) are arranged in an array form over the substrate 11.

Note that this section has described the case of the electrode layers 13 and 15 each having the stripe-form pattern. Therefore, the organic EL elements, that are arranged in the X direction, of the plurality of organic EL elements (pixels) arranged in the array form have the lower electrodes (electrodes 13a) that are connected to each other, and the organic EL elements, that are arranged in the Y direction, thereof have the upper electrodes (electrodes 15a) that are connected to each other. However, the present invention is not limited to this structure, and the structure of the organic EL elements that are arranged in the array form can be variously changed.

For example, the plurality of organic EL elements arranged in the array form are not connected to each other even at the upper electrodes or the lower electrodes, and may be independently arranged in some cases. In this case, each organic EL element is made of an isolated pattern having the layered structure made of the lower electrode, the organic layer and the upper electrode, and a plurality of the isolated organic EL elements are arranged in the array form. In this case, an active element such as a TFT (thin film transistor) can be arranged at each pixel in addition to the organic EL elements, and the pixels can be connected to each other through a wiring if needed.

Over the upper surface of the substrate 11 (passivation film 12), the protecting film (protecting layer) 16 is formed so as to cover the organic EL element, thus, so as to cover the electrode layer 13, the organic layer 14 and the electrode layer 15. When the array-form organic EL elements are arranged in the display unit 2, the protecting film 16 is formed so as to cover the array-form organic EL elements. Therefore, it is preferable to form the protecting film 16 over the entire display unit 2 and almost over the entire upper surface of the substrate 11. Since the organic EL element (the electrode layer 13, the organic layer 14 and the electrode layer 15) is covered with the protecting film 16, the organic EL element (the electrode layer 13, the organic layer 14 and the electrode layer 15) can be protected, and the transmission of water to the organic EL element, that is, the transmission of water particularly to the organic layer 14 can be prevented (blocked) by the protecting film 16. That is, by the formation of the protecting film 16, the infiltration of water into the organic EL element beyond the protecting film 16 can be prevented. The protecting film 16 is a protecting film for use in the organic EL element.

However, it may be necessary to expose apart of the electrodes or wirings from the protecting film 16. In such a case, while the protecting film 16 is not formed in the entire region on the upper surface side of the substrate 11, a region without the protecting film 16 is formed in a part on the upper surface side of the substrate 11, and a part of the electrodes or wirings can be exposed from the region (the region without the protecting film 16). However, even in this case, it is preferable not to expose the organic layer 14 from the region without the protecting film 16.

The protecting film 16 is made of an inorganic insulating material, and is an insulating film formed by an ALD (Atomic Layer Deposition) method, that is, an ALD film. The ALD method is a film-forming method of forming a film over a process target in terms of an atomic layer by alternately supplying a source gas and a reaction gas. As a material of the protecting film 16, silicon oxide, silicon nitride, silicon oxynitride, titanium oxide, zirconium oxide, aluminum oxide, aluminum oxynitride or aluminum nitride is preferable, and aluminum oxide, aluminum oxynitride or aluminum nitride is particularly preferable.

In the present embodiment, the protecting film 16 has a layered structure made of one or more high-density layers (high-density films) 16H and one or more low-density layers (low-density films) 16L having a lower density than that of the high-density layer 16H so that the low-density layer 16L and the high-density layer 16H are alternately layered so as to be in contact with each other.

Note that the high-density layer 16H and the low-density layer 16L configuring the protecting film 16 have the same constituent element as each other. That is, the protecting film 16 is made of the one or more high-density layers 16H and the one or more low-density layers 16L so that the layers are made of the same material as each other. Therefore, for example, when the high-density layer 16H configuring the protecting film 16 is made of aluminum oxide, the low-density layer 16L configuring the protecting film 16 is also made of aluminum oxide. When the high-density layer 16H configuring the protecting film 16 is made of aluminum oxynitride, the low-density layer 16L configuring the protecting film 16 is also made of aluminum oxynitride. When the high-density layer 16H configuring the protecting film 16 is made of aluminum nitride, the low-density layer 16L configuring the protecting film 16 is also made of aluminum nitride. When the protecting film 16 includes a plurality of the high-density layers 16H, the plurality of the high-density layers 16H have the same constituent element as one another, that is, are made of the same material as one another. When the protecting film 16 includes a plurality of the low-density layers 16L, the plurality of the low-density layers 16L have the same constituent element as one another, that is, are made of the same material as one another. Therefore, the protecting film 16 has the layered structure made of the plurality of layers, and the layers configuring the layered structure are made of the same material as one another, and therefore, the entire protecting film 16 is made of the same material. Since the protecting film 16 is formed by the ALD method, each of the high-density layers 16H and the low-density layers 16L configuring the protecting film 16 is also formed by the ALD method.

As one example, FIG. 3 shows a case in which the protecting film 16 has the layered structure obtained by layering the high-density layer 16H, the low-density layer 16L and the high-density layer 16H in this order from below upward. That is, the protecting film 16 of FIG. 3 corresponds to a protecting film 16 of FIG. 20 described later. However, as the protecting film 16 of FIG. 3, any protecting film 16 described and shown later in FIGS. 17, 18, 19, 20, 23, 24, 25, 26 and 27 is also applicable.

Over the protecting film 16, an insulating film 17 made of a different material from that of the protecting film 16 is formed. The insulating film 17 is preferably a resin film (resin layer, resin insulating film, organic insulating film).

As a material of the insulating film 17, for example, PET (polyethylene terephthalate) or others can be preferably used. The formation of the insulating film 17 can be eliminated. However, the case with the formation of the insulating film 17 is more advantage than the case without the formation of the insulating film 17 in some cases.

The protecting film 16 is the inorganic insulating film. The inorganic insulating film is a film in which water is difficult to pass but is a hard film. Therefore, a resin film (insulating film 17) can be formed over the protecting film 16, and the resin film (insulating film 17) can be also used as the uppermost layer film of the display apparatus 1. It is easier to allow the water to pass the resin film (insulating film 17) than the inorganic insulating film (protecting film 16), and therefore, the resin film (insulating film 17) has a smaller function serving as a film preventing the infiltration of the water. However, the resin film (insulating film 17) is softer than the inorganic insulating film (protecting film 16). Therefore, the soft resin film (insulating film 17) is formed over the protecting film 16, so that the display apparatus 1 is easily handled. And, the resin film (insulating film 17) can function as a protecting film (mechanical protecting film) against physical impact. When the flexible substrate is used as the substrate 11, the resin film (insulating film 17) is formed over the protecting film 16, so that occurrence of cracks in the protecting film 16 when deforming is easily prevented.

When the resin film 17 is formed over the protecting film 16, a combined substance of the protecting film 16 and the resin film 17 can be regarded as the protecting film. However, when the insulating film 17 made of the resin film is formed, the protecting film 16 functions as the film (water blocking film) blocking the infiltration of the water, and the insulating film 17 made of the resin film mainly functions as the mechanical protecting film. The water protecting film (in this case, the protecting film 16) is preferably made of the inorganic insulating material, and the mechanical protecting film (in this case, the insulating film 17) is preferably made of the resin material (organic insulating material).

Figure 4:
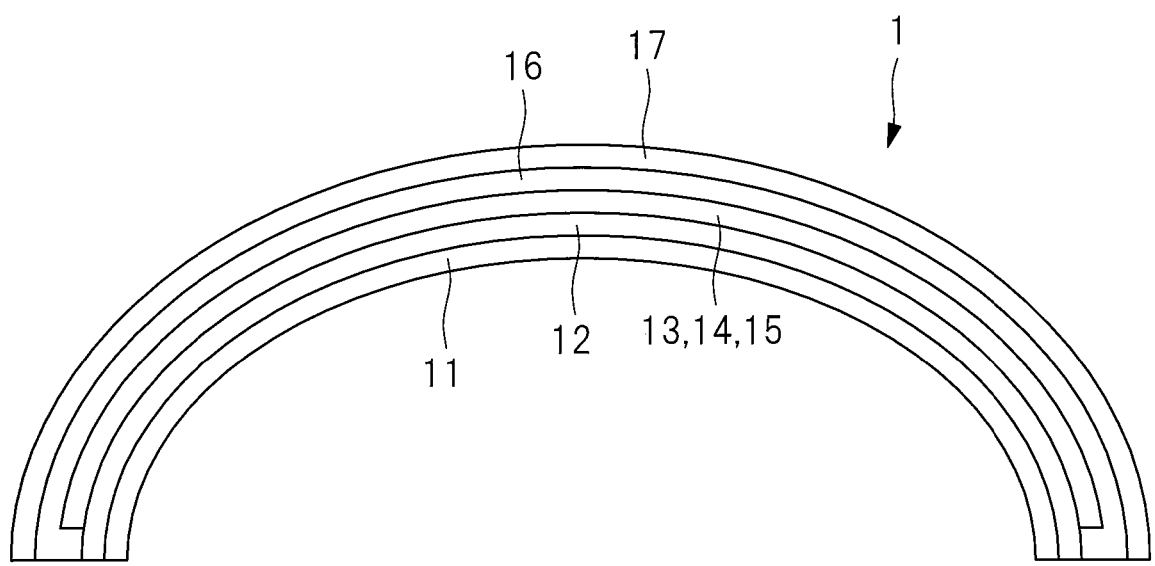
FIG. 4 is a cross-sectional view schematically showing a case of using a flexible substrate as a substrate for the display apparatus and bending the flexible substrate (display apparatus)

In the present embodiment, the flexible substrate is used as the substrate 11 of the display apparatus 1. FIG. 4 is a cross-sectional view schematically showing a case in which the substrate 11 (flexible substrate) of the display apparatus 1 is bent, that is, in which the display apparatus 1 is bent. Although FIG. 4 is the cross-sectional view, hatching is omitted in order to easily see the drawing. When the flexible substrate is used as the substrate 11 of the display apparatus 1, the display apparatus 1 is bendable. And, the substrate 11 is the flexible substrate, and can be regarded as a bendable substrate since the substrate can be repeatedly bent, and besides, can be regarded as a foldable substrate since the substrate can be folded. Therefore, the substrate 11 is the flexible substrate, and the flexible substrates include the bendable substrate and the foldable substrate.

<Method of Manufacturing Display Apparatus>

Figure 5:
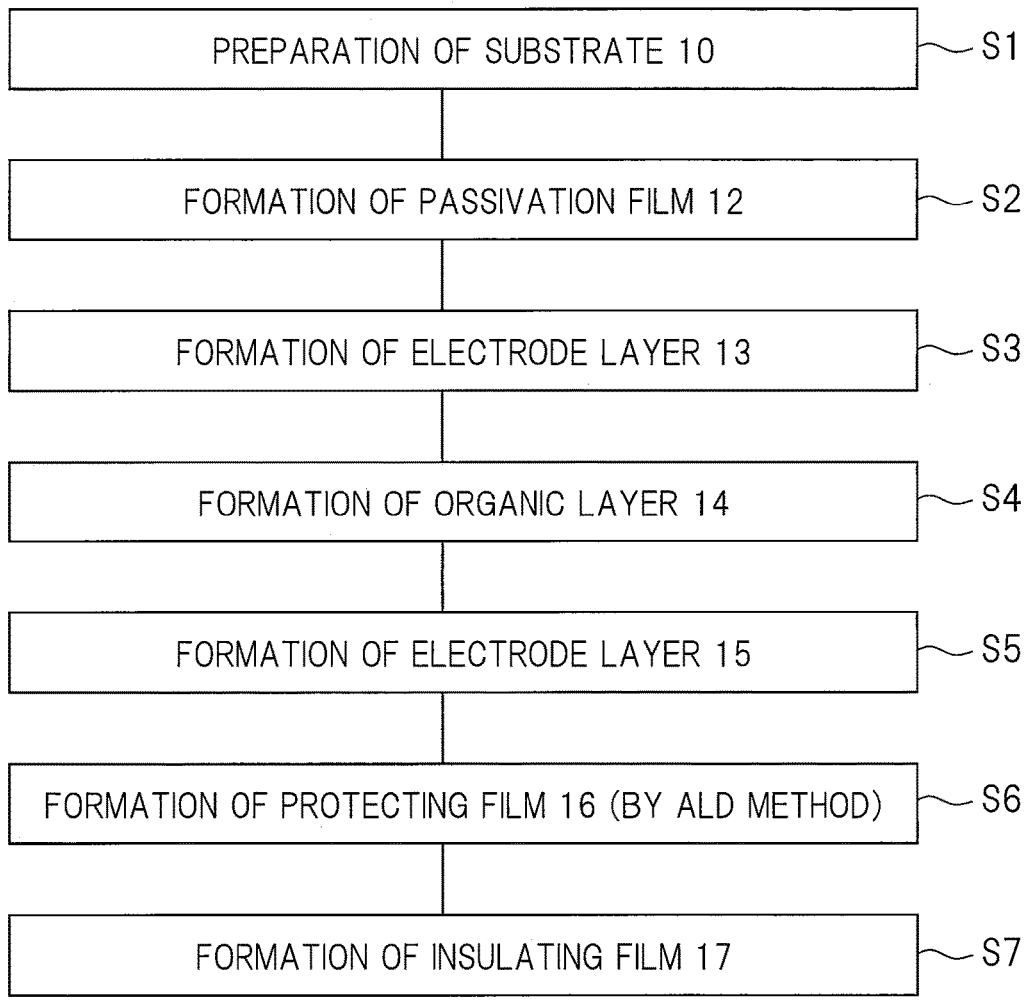
FIG. 5 is a process flowchart showing steps of manufacturing the display apparatus of one embodiment.
Figure 6:
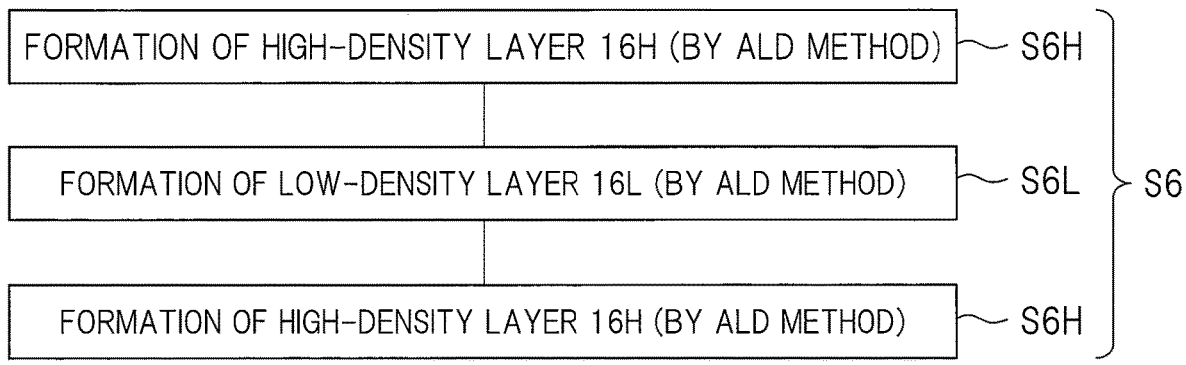
FIG. 6 is a process flowchart showing a protecting film forming step of the steps of manufacturing the display apparatus of one embodiment.

A method of manufacturing the display apparatus 1 of the present embodiment will be described with reference to the drawings. FIG. 5 is a process flowchart showing steps of manufacturing the display apparatus 1 of the present embodiment. FIG. 6 is a process flowchart showing details of steps of forming the protecting film 16 of the steps of manufacturing the display apparatus 1 of the present embodiment. Each of FIGS. 7 to 12 is a cross-sectional view of a principal part in the steps of manufacturing the display apparatus 1 of the present embodiment, and shows a cross-sectional view of a region corresponding to FIG. 3 described above. In this case, note that steps of manufacturing the display unit 2 of the display apparatus 1 will be mainly described.

Figure 7:
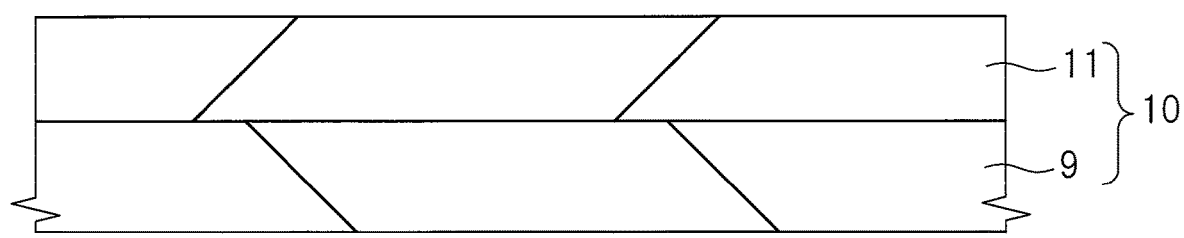
FIG. 7 is a cross-sectional view of a principal part in a step of manufacturing the display apparatus of one embodiment.

First, as shown in FIG. 7, a substrate 10 formed by pasting a glass substrate 9 and the substrate 11 that is the flexible substrate is provided (prepared) (a step S1 of FIG. 5). While the substrate 11 has the flexibility, the substrate 11 is fixed to the glass substrate 9 since the substrate 11 is pasted to the glass substrate 9. In the manner, it is easy to form various films over the substrate 11 and process the films. Note that the lower surface of the substrate 11 is pasted to the glass substrate 9.

Figure 8:
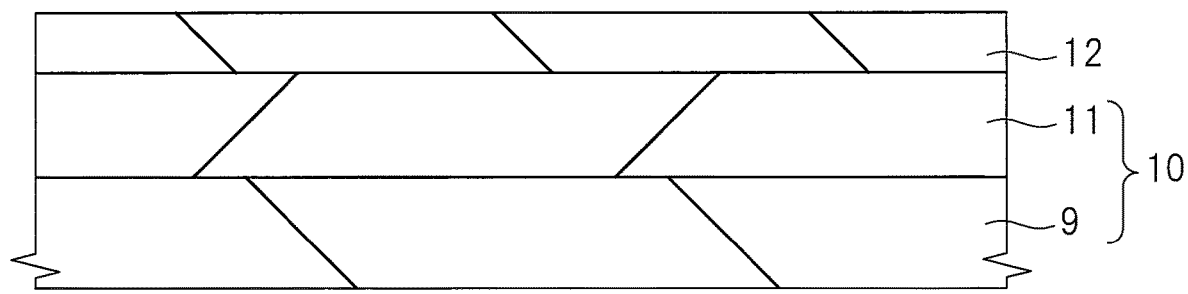
FIG. 8 is a cross-sectional view of a principal part in a step of manufacturing the display apparatus, continued from FIG. 7.

Next, as shown in FIG. 8, the passivation film 12 is formed over the upper surface of the substrate 10 (a step S2 of FIG. 5). Note that the upper surface of the substrate 10 is synonymous with the upper surface of the substrate 11.

The passivation film 12 can be formed by using a sputtering method, a CVD method, an ALD method or others. The passivation film 12 is made of an insulating material, and is, for example, a silicon oxide film. For example, a silicon oxide film formed by the CVD method can be favorably used as the passivation film 12.

Figure 9:
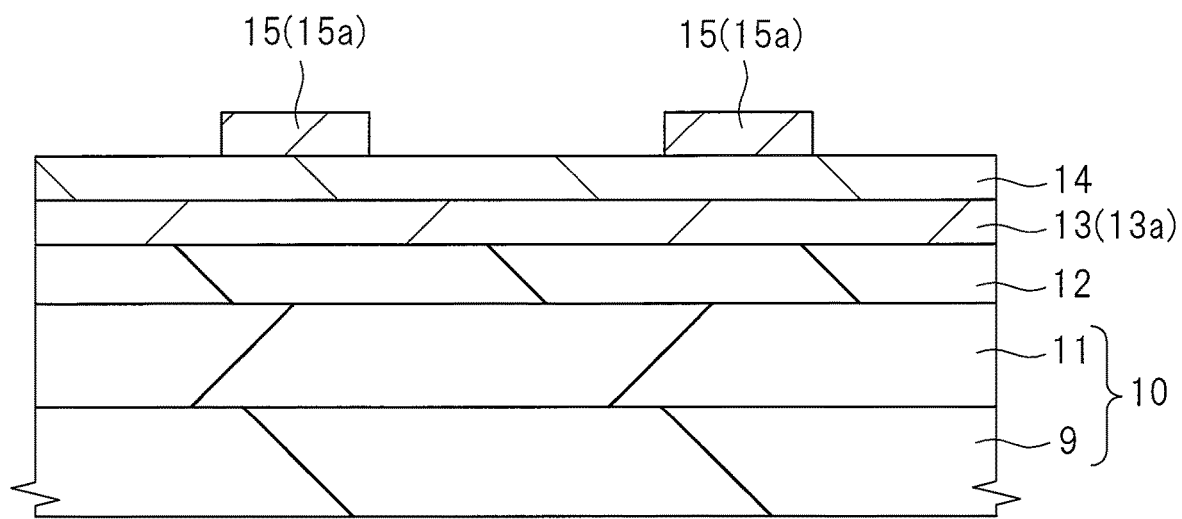
FIG. 9 is a cross-sectional view of a principal part in a step of manufacturing the display apparatus, continued from FIG. 8.

Next, as shown in FIG. 9, an organic EL element made of an electrode layer 13, an organic layer 14 over the electrode layer 13 and an electrode layer 15 over the organic layer 14 is formed over an upper surface of the substrate 10, that is, over the passivation film 12. That is, the electrode layer 13, the organic layer 14 and the electrode layer 15 are sequentially formed over the passivation film 12 (steps S3, S4 and S5 in FIG. 5). For example, this process can be performed as follows.

That is, the electrode layer 13 is formed over the upper surface of the substrate 10, that is, over the passivation film 12 (the step S3 in FIG. 5). The electrode layer 13 can be formed by, for example, forming a conductive film over the passivation film 12, and then, patterning this conductive film by using a photolithography technique, an etching technique and others. Then, the organic layer 14 is formed over the electrode layer 13 (the step S4 in FIG. 5). The organic layer 14 can be formed by, for example, a vapor deposition method (vacuum vapor deposition method) using a mask or others. Then, the electrode layer 15 is formed over the organic layer 14 (the step S5 in FIG. 5). The electrode layer 15 can be formed by, for example, a vapor deposition method using a mask or others.

Figure 10:
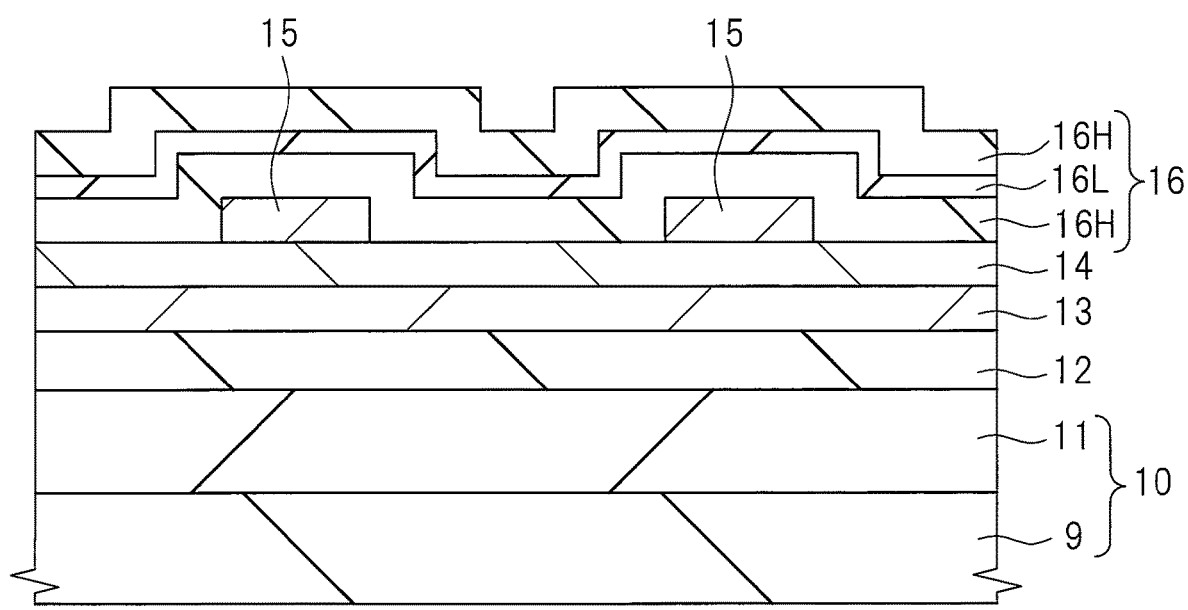
FIG. 10 is a cross-sectional view of a principal part in a step of manufacturing the display apparatus, continued from FIG. 9.

After the organic EL element made of the electrode layer 13, the organic layer 14 and the electrode layer 15 is formed, a protecting film 16 is formed over the upper surface of the substrate 10, that is, over the electrode layer 15 by using an ALD method as shown in FIG. 10 (a step S6 in FIG. 5). The protecting film 16 is formed so as to cover the organic EL element.

The protecting film 16 has a layered structure made of one or more high-density layers 16H and one or more low-density layers 16L having a lower density than that of the high-density layer 16H so that the low-density layer 16L and the high-density layer 16H are alternately layered so as to be in contact with each other. Therefore, in the step S6 (step of forming the protecting film 16), the protecting film 16 is formed by alternately performing a step (a step S6H in FIG. 6) of forming the high-density layer 16H by using an ALD method and a step (a step S6L in FIG. 6) of forming the low-density layer 16L by using an ALD method. In the step S6, the step S6H is performed once or more times, and the step S6L is also performed once or more times.

For example, when the protecting film 16 has a layered structure in which the high-density layer 16H, the low-density layer 16L and the high-density layer 16H are layered in this order from below upward as shown in FIG. 10, the protecting film 16 can be formed by sequentially performing the step S6H (step of forming the high-density layer 16H), the step S6L (step of forming the low-density layer 16L) and the step S6H (step of forming the high-density layer 16H) in the step S6. That is, a high-density layer 16H is formed first over the substrate 10, that is, over the electrode layer 15 by using the ALD method, then, a low-density layer 16L is formed over this high-density layer 16H by using the ALD method, and then, a high-density layer 16H is formed over this low-density layer 16L by using the ALD method, so that the protecting film 16 is made of the high-density layer 16H, the low-density layer 16L over this high-density layer 16H, and the high-density layer 16H over this low-density layer 16L.

It may be necessary to expose a part of electrode or wires from the protecting film 16 in some cases. In such a case, the protecting film 16 is not formed in the entire region of the upper surface of the substrate 10, a region without the protecting film 16 is formed in a part of the upper surface of the substrate 10, and a part of the electrodes or wirings is exposed from the region (the region without the protecting film 16). In this case, the step of forming the protecting film 16 in the step S6 can be performed, for example, as follows. That is, first, the protecting film 16 is formed by using the ALD method after a mask (metal mask) is arranged over the substrate 10, that is, over the electrode layer 15, and then, the mask is removed. In the manner, the protecting film 16 is formed in the region not covered with the mask but exposed while the protecting film 16 is not formed in the region covered with the mask. In the manner, the protecting film 16 can be formed so as to cover the organic El element, and the electrodes or the wirings can be exposed from the region without the protecting film 16 if needed.

When the protecting film 16 is formed, the organic EL element made of the electrode layer 13, the organic layer 14 and the electrode layer 15 is covered with the protecting film 16. When a plurality of organic EL elements are arranged in an array form, the plurality of organic EL elements are covered with the protecting film 16.

Figure 11:
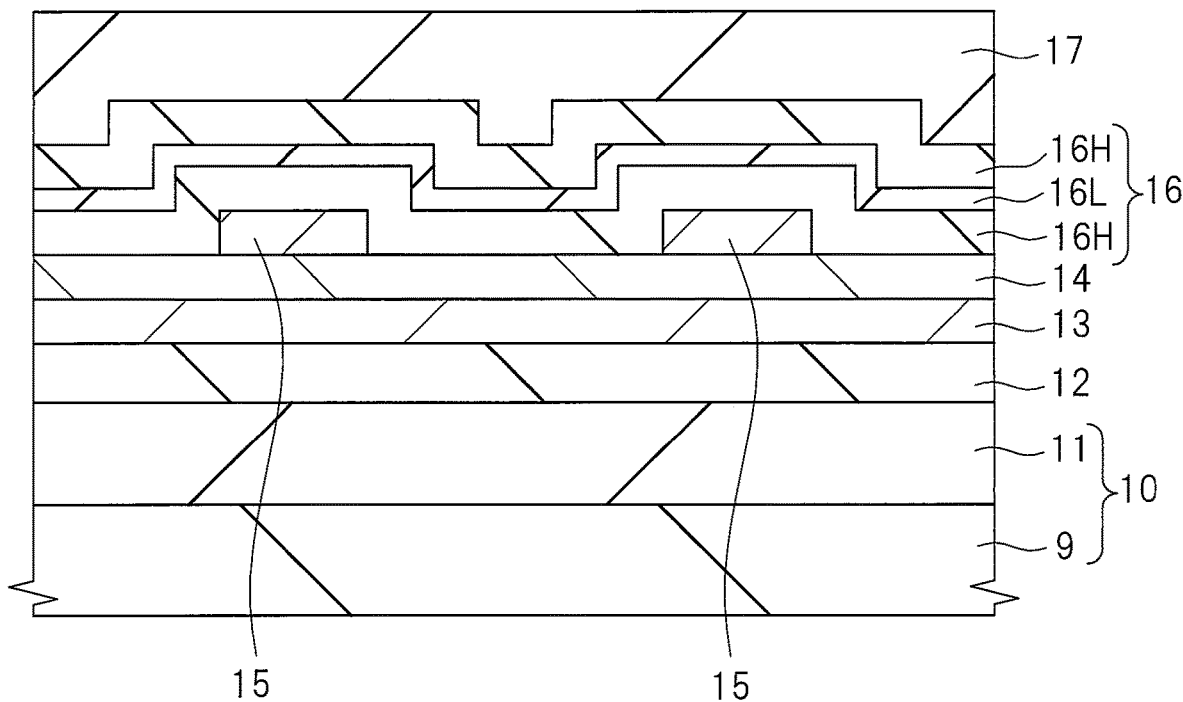
FIG. 11 is a cross-sectional view of a principal part in a step of manufacturing the display apparatus, continued from FIG. 10.

After the protecting film 16 is formed in the step S6, an insulating film 17 is formed over the upper surface of the substrate 10, that is, over the protecting film 16 as shown in FIG. 11 (a step S7 in FIG. 5).

The insulating film 17 is preferably made of a resin film such as a PET film, and can be formed by using a spin coating method (coating method) or others.

Figure 12:
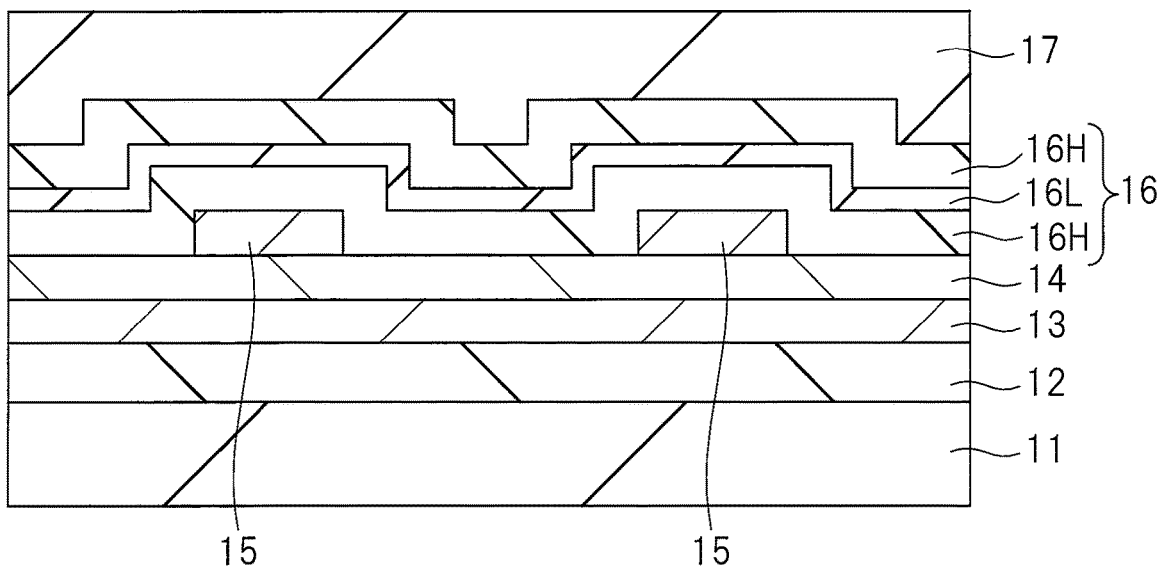
FIG. 12 is a cross-sectional view of a principal part in a step of manufacturing the display apparatus, continued from FIG. 11.

Then, the substrate 11 is peeled off from the glass substrate 9 as shown in FIG. 12, so that the substrate 11 and a structure body over the upper surface of the substrate are separated from the glass substrate 9. In the manner, the display apparatus 1 can be manufactured.

<Film-Forming Apparatus>

Figure 13:
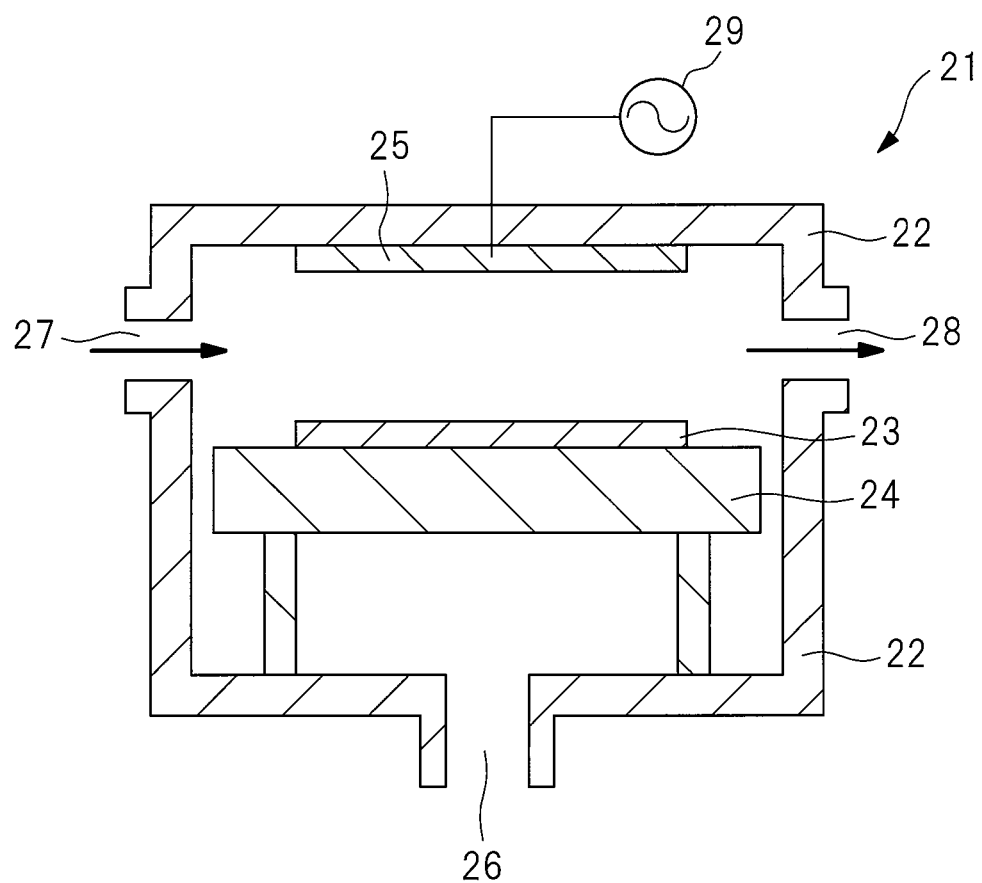
FIG. 13 is an explanatory diagram showing one example of a film-forming apparatus for use in the formation of the protecting film.

FIG. 13 is an explanatory diagram (cross-sectional view) showing one example of a film-forming apparatus 21 for use in the formation of the protecting film 16. The film-forming apparatus 21 is a film-forming apparatus that forms a film by using the ALD method, and can be regarded as an ALD apparatus or an ALD film-forming apparatus. In the present embodiment, a plasma ALD apparatus (plasma ALD film-forming apparatus) is used as the film-forming apparatus 21, and a plasma ALD method is used as the ALD method for the formation of the protecting film 16. The plasma ALD apparatus performs plasma charge to generate plasma of reaction gas in order to enhance a reaction activity. Therefore, in the plasma ALD apparatus, a parallel plate electrode or others is used for the plasma charge.

As shown in FIG. 13, the film-forming apparatus 21 has a chamber (film-forming chamber, film-forming container) 22 in which the film is formed by the ALD method. A stage 24 for use in arrangement of the process target 23 and an upper electrode (plate electrode) 25 arranged above the stage 24 are arranged inside the chamber 22. A high-frequency power supply 29 is connected to the upper electrode 25, and a high-frequency power can be applied to the upper electrode 25, thus, between the upper electrode 25 and the stage 24 by the high-frequency power supply 29. The stage 24 also has a function serving as a lower electrode. The parallel plate electrode can be made of the upper electrode 25 and the lower electrode (in this case, the stage 24). The high-frequency power supply 29 can be arranged out of the chamber 22. The stage 24 includes a heater (not illustrated) or others so that the process target 23 arranged over the state 24 can be heated to adjust a temperature of the process target 23 to a desirable temperature. An exhaust unit (exhaust port) 26 of the chamber 22 is connected to a vacuum pump (not illustrated) or others so that a pressure inside the chamber 22 can be controlled to a predetermined pressure. And, the chamber 22 has a gas inlet 27 for use in introduction of gas into the chamber 22 and a gas outlet (gas exhaust unit) 28 for use in exhaust of gas from the chamber 22. In FIG. 13, note that each of a flow of gas introduced from the gas inlet 27 into the chamber 22 and a flow of gas exhausted from the gas outlet 28 to outside of the chamber 22 is schematically denoted with an arrow for easily understanding the flows.

Note that FIG. 13 shows the film-forming apparatus using the parallel plate electrode for the generation of the plasma. However, as another embodiment, instead of the parallel plate type, a mode (for example, an ICP (Inductively Coupled Plasma) type) can be also used for the generation of the plasma.

<Film Formation using ALD Method>

The film formation using the film-forming apparatus 21 (the film formation using the ALD method) can be formed, for example, as follows.

After the step previous to the step of forming the protecting film 16 ends, the process target is arranged over the stage 24 inside the chamber 22 of the film-forming apparatus 21 for the step of forming the protecting film 16. In this case, the process target 23 arranged over the stage 24 is the substrate 10 where the above-described passivation film 12, electrode layer 13, organic layer 14, electrode layer 15 and others are formed so that the structure of FIG. 9 is formed over the substrate 10, and is shown as the process target 23 denoted with a symbol 23 in FIG. 13. Then, a plurality of times of a cycle made of a first step, a second step, a third step and a fourth step that are repeated and described later are performed, so that a desirable film (such as an aluminum oxide film) can be formed over a surface of the process target 23 so as to have a desirable thickness.

Hereinafter, the steps will be specifically described.

First, as the first step (a source-gas supply step), a source gas is introduced (supplied) from the gas inlet 27 into the chamber 22. For the formation of the aluminum oxide film, for example, TMA (Trimethyl aluminium) gas can be used as the source gas. Under the first step, molecules of the source gas are adsorbed over the surface of the process target 23 arranged over the stage 24. That is, over the surface of the process target 23, an adsorption layer of the source gas is formed.

Next, as the second step (purge step), the introduction of the source gas into the chamber 22 stops, and purge gas is introduced (supplied) from the gas inlet 27 into the chamber 22. As the purge gas, inert gas can be favorably used, and nitrogen gas ($N_2$ gas) may be used in some cases. By the introduction of the purge gas, while the source gas modules adsorbed over the surface of the process target 23 (the adsorption layer of the source gas) are left, other source gas is exhausted (purged) together with the purge gas from the gas outlet 28 to the outside of the chamber 22.

Next, as the third step (reaction-gas supply step), reaction gas is introduced (supplied) from the gas inlet 27 into the chamber 22. For the formation of the aluminum oxide film, for example, $O_2$ gas (oxygen gas) can be used as the reaction gas. A high-frequency power is applied to the upper electrode 25, thus, between the upper electrode 25 and the stage 24. In the manner, the plasma charge is generated between the upper electrode 25 and the stage 24 to generate the plasma of the reaction gas (in this case, the $O_2$ gas), so that radicals (active species) are generated in the reaction gas, and the source-gas molecules adsorbed over the surface of the process target 23 (the adsorption layer of the source gas) react with the reaction gas. In the manner, (one) atomic layer made of aluminum oxide is formed over the surface of the process target 23, the atomic layer being a reaction layer of the adsorption layer of the source gas and the reaction gas (the plasma of the reaction gas).

Next, as the fourth step (purge step), the introduction of the reaction gas into the chamber 22 and the application of the high-frequency power to the upper electrode 25 stop, and purge gas is introduced (supplied) from the gas inlet 27 into the chamber 22. As the purge gas, inert gas can be favorably used, and nitrogen gas ($N_2$ gas) may be used in some cases. By the introduction of the purge gas, the reaction gas is exhausted (purged) together with the purge gas from the gas outlet 28 to the outside of the chamber 22.

The plurality of times of the cycle made of the first step, the second step, the third step and the fourth step as described above that are repeated are performed, so that a desirable film (such as the aluminum oxide film) can be formed over the surface of the process target 23 so as to have a desirable thickness. For example, when 30 cycles each made of the first step, the second step, the third step and the fourth step that are repeated are performed, a film made of 30 atomic layers is formed. When 60 cycles each made of the first step, the second step, the third step and the fourth step that are repeated are performed, a film made of 60 atomic layers is formed.

After the formation of the protecting film 16 over the process target 23 ends, the process target 23 is carried out from the chamber 22 of the film-forming apparatus 21 to the outside of the chamber 22, and is fed to a next step.

<Background on Study>

The organic EL element is weak against water, and therefore, it is desirable to form the protecting film (water protecting film) so as to cover the organic EL element to prevent the transmission of the water to the organic EL element. As this protecting film, it is desirable to use an inorganic insulating film having high effect preventing the infiltration of the water. The organic EL element is weak against high temperature, and therefore, a film-forming temperature of the protecting film is preferably relatively low so as not to adversely affect the organic EL element. Therefore, as the protecting film, it is preferable to use a material film that can be formed at a relatively low temperature.

Incidentally, the present inventors have studied the usage of the flexible substrate as the substrate where the organic EL element is formed. Since the flexible substrate has flexibility, the substrate is bendable. When the flexible substrate is used as the substrate for the organic EL display apparatus, the display apparatus is bendable.

When the flexible substrate is used, the protecting film is bent together with the flexible substrate, and therefore, a resistance property of the protecting film against the bending is also important. However, the inorganic insulating film is excellent as the protecting film (water protecting film) but is made of a more rigid material than that of the resin film and others. Therefore, when the flexible substrate is used as the substrate, there is a risk of occurrence of clacks of the protecting film made of the inorganic insulating film due to the bending. That is, when the flexible substrate is bent at a small bending radius, the protecting film is also bent at a small bending radius due to the bending, and there is a risk of occurrence of cracks in the protecting film due to the bending. The occurrence of the cracks in the protecting film undesirably causes a risk of allowing the water to infiltrate the organic EL element through the cracks to transmit the water to the organic EL element, which results in deterioration of the organic EL element. This undesirably causes reduction in reliability of the organic EL element and reduction in reliability of the display apparatus (organic EL display apparatus) using the organic EL element.

Figure 14:
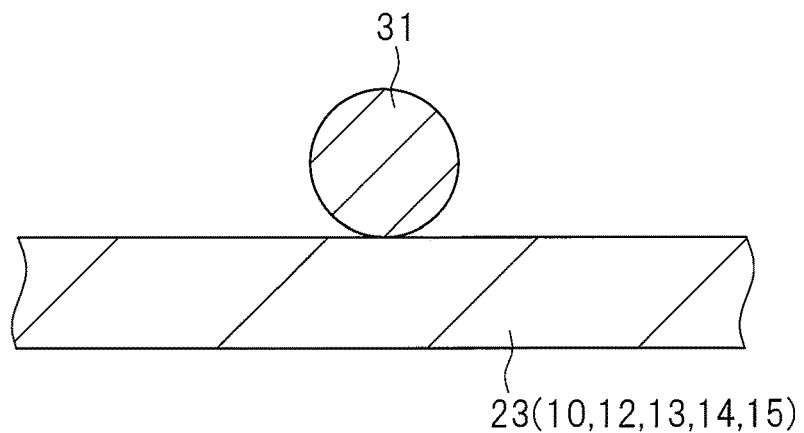
FIG. 14 is an explanatory diagram explaining a problem related to adhesion of particles.
Figure 15:
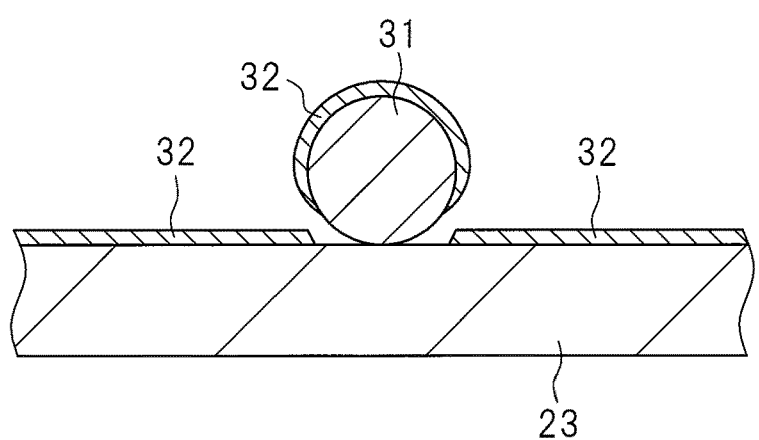
FIG. 15 is an explanatory diagram explaining a problem related to adhesion of particles.
Figure 16:
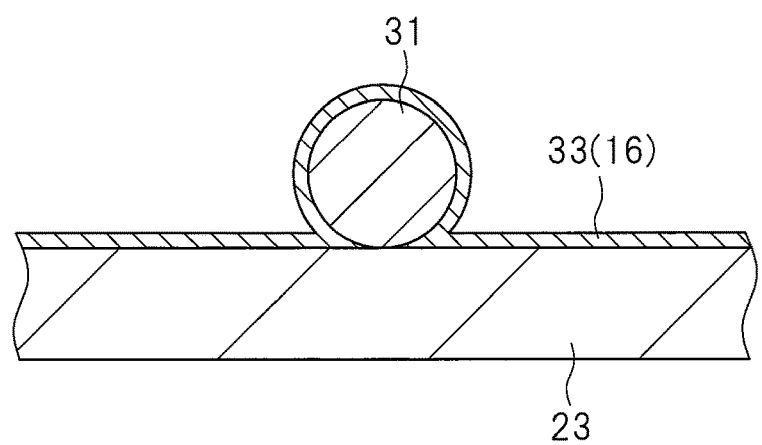
FIG. 16 is an explanatory diagram explaining a problem related to adhesion of particles.

Accordingly, it is considered that the resistance property of the protecting film against the bending is improved by thinning the protecting film. The thinning of the protecting film is difficult to cause the cracks in the protecting film due to the bending. However, because of the following reasons (reasons described with reference to FIGS. 14 to 16), it is necessary to thicken the protecting film to some extent. FIGS. 14 to 16 are explanatory diagrams (cross-sectional views) each explaining a problem related to adhesion of particles.

FIG. 14 shows the process target 23 to be processed for the formation of the protecting film. This process target 23 corresponds to a combined body of the above-described substrate 10, passivation film 12, electrode layer 13, organic layer 14 and electrode layer 15 as described above.

FIG. 14 shows the process target 23 at a stage immediately previous to the formation of the protecting film. At this stage, as shown in FIG. 14, particles (foreign substances) 31 may be adsorbed over the surface of the process target 23 in some cases. For examples, the cases may include a case in which the particles 31 caused by various steps (such as the film-forming step) previous to the formation of the protecting film are adsorbed over the process target 23, a case in which the particles 31 existing inside the film-forming apparatus from the step of carrying of the process target 23 into the film-forming apparatus for use in the formation of the protecting film to the step of the start of the film formation of the protecting film are adsorbed over the process target 23, and others. It is not easy to completely prevent the adsorption of the particles 31 over the surface of the process target 23. Therefore, in order to easily manage the manufacturing steps to easily manufacture the organic EL display apparatus or others, it is desirable to form the protecting film allowing the particles 31 to be adsorbed over the surface of the process target 23 to some extent.

Each of FIGS. 15 and 16 shows a state of the formation of the protecting film over the process target 23 where the particles 31 are adsorbed as shown in FIG. 14. FIG. 15 of FIGS. 15 and 16 shows a case of formation of a protecting film 32 by using a CVD method, and FIG. 16 thereof shows a case of formation of a protecting film 33 by using an ALD method. Note that each of the protecting films 32 and 33 corresponds to the protecting film 16 of the present embodiment.

When the protecting film 32 is formed by using the CVD method in a state in which the particles 31 are adsorbed over the process target 23, the protecting film 32 is formed over a surface of the process target 23 and surfaces of the particles 31 adsorbed over the process target 23. However, when the protecting film 32 is formed by using the CVD method, it is difficult to form the protecting film 32 in a region shielded by the particles 31 in the surface of the process target 23 and the surfaces of the particles 31 as shown in FIG. 15, and therefore, the protecting film 32 is undesirably not formed in vicinity of bonding regions between the process target 23 and the particles 31. Therefore, when the protecting film 32 is formed by using the CVD method as shown in FIG. 15, there is a risk of occurrence of dropping off of the particles 31 to cause a problem after the formation of the protecting film 32. For example, when the particles 31 drop off after the formation of the protecting film 32, the water undesirably infiltrates from a portion at which the particle 31 drop off since the protecting film 32 is not formed in the portion, and there is a risk of the transmission of the water to the organic EL element to deteriorate the organic EL element. This leads to the reduction in reliability of the organic EL element and the reduction in reliability of the display apparatus (organic EL display apparatus) using the organic EL element.

When the protecting film 33 is formed by using the ALD method in a state in which the particles 31 are adsorbed over the process target 23, the protecting film 33 is formed over a surface of the process target 23 and surfaces of the particles 31 adsorbed over the process target 23. The ALD method is a film-forming method that is excellent in coverage of a base material by the formed film, and therefore, when the protecting film 33 is formed by using the ALD method, it is easy to form the protecting film 33 also in the region shielded by the particles 31 in the surface of the process target 23 and the surfaces of the particles 31 as shown in FIG. 16, and the protecting film 33 can be also formed in vicinity of the bonding regions between the process target 23 and the particles 31. That is, when the protecting film 33 is formed by using the ALD method in the state in which the particles 31 are adsorbed over the process target 23, the protecting film 33 is formed over the entire surface of the process target 23 where the particles 31 are adsorbed, and the entire surfaces of the particles 31 are covered with the protecting film 33, as shown in FIG. 16. That is, the protecting film 33 covering the surfaces of the particles 31 and the protecting film 33 covering the surface of the process target 23 are consecutively connected to each other. Therefore, when the protecting film 33 is formed by using the ALD method in the state in which the particles 31 are adsorbed over the process target 23 as shown in FIG. 16, the particles 31 are protected by the protecting film 33 after the formation of the protecting film 33, and the particles 31 are difficult to drop off, and therefore, it is difficult to cause the problem due to the dropping off of the particles 31.

Therefore, the present inventors have studied the formation of the protecting film using the ALD method. However, even if the protecting film 33 is formed by using the ALD method, when the protecting film 33 is thin, the effect of holding the particles 31 by the protecting film 33 is weakened, and therefore, there is still the small risk of the dropping off of the particles 31 after the formation of the protecting film 33. Therefore, it is desirable to form the protecting film by the ALD method, and to thicken the protecting film to some extent, and these techniques can reliably suppress or prevent the dropping off of the particles 31 after the formation of the protecting film.

However, as described above, the thick protecting film causes the reduction in the resistance property of the protecting film against the bending so that it is easy to cause the cracks in the protecting film due to the bending. That is, when the protecting film is thin, while it is difficult to cause the cracks in the protecting film due to the bending, the risk of the dropping off of the particles 31 after the formation of the protecting film increases. On the other hand, when the protecting film is thick, while the risk of the dropping off of the particles 31 after the formation of the protecting film decreases, the risk of the occurrence of the cracks in the protecting film due to the bending increases. Both the dropping off of the particles 31 after the formation of the protecting film and the occurrence of the cracks in the protecting film due to the bending cause the reduction in reliability of the organic EL element and the reduction in reliability of the display apparatus (organic EL display apparatus) using the organic EL element.

Therefore, when the flexible substrate is used, it is desirable to, even if the thickness is not reduced, provide a protecting film that is difficult to cause the cracks due to the bending by forming the protecting film by the ALD method and improving the reliability of the protecting film.

<Principal Features and Effects>

One of principal features of the present embodiment is the usage of the flexible substrate as the substrate 11. Another one of principal features of the present embodiment is the formation of the protecting film 16 made of the inorganic insulating material by the ALD method. Still another one of the principal features of the present embodiment is the control of the density of the protecting film 16. Specifically, the protecting film 16 has the layered structure made of the one or more high-density layers 16H and the one or more low-density layers 16L having a lower density than that of the high-density layer 16H so that the low-density layer 16L and the high-density layer 16H are alternately layered so as to be in contact with each other.

Note that the low-density layer 16L has the lower density than that of the high-density layer 16H. In other words, the high-density layer 16H has a higher density than that of the low-density layer 16L. Since the protecting film 16 is formed by the ALD method, both the high-density layer 16H and the low-density layer 16L are formed by the ALD method.

The high-density layer 16H and the low-density layer 16L configuring the protecting film 16 have the same constituent element as each other, in other words, are made of the same material (same material type). When the protecting film 16 includes a plurality of the high-density layers 16H, the plurality of the high-density layers 16H have the same constituent element as one another, in other words, are made of the same material (same material type). When the protecting film 16 includes a plurality of the low-density layers 16L, the plurality of the low-density layers 16L have the same constituent element as one another, in other words, are made of the same material (same material type). That is, although the protecting film 16 is made of the same material as a whole, the density is not even.

In the present embodiment, the density of the low-density layer 16L is lower than the density of the high-density layer 16H, and the density in this case corresponds to an atomic density (the number of atoms per unit volume: atoms/cm$^3$). That is, in comparison in terms of the atomic density, the density of the low-density layer 16L is lower than the density of the high-density layer 16H. However, the low-density layer 16L and the high-density layer 16H have the same constituent element and are made of the same material as each other. Therefore, when the atomic density is large, a weight density (weight per unit volume: g/cm$^3$) is essentially large. Therefore, when the density of the low-density layer 16L is lower than the density of the high-density layer 16H in the comparison in terms of the atomic density, the density of the low-density layer 16L is also lower than the density of the high-density layer 16H in the comparison in terms of the weight density, and conversely. As described later, the density of the low-density layer 16L is preferable to be 80 to 95% of the density of the high-density layer 16H, and this is a relation that can be established in the comparison in terms of the atomic density. However, the relation can be also substantially established in the comparison in terms of the weight density.

The fact that the protecting film 16 has the layered structure in which the low-density layer 16L and the high-density layer 16H are alternately layered so as to be in contact with each other means that the high-density layer 16H exists over the low-density layer 16L while the low-density layer 16L exists over the high-density layer 16H except for the uppermost layer in the layered structure configuring the protecting film 16. The protecting film 16 made of the one or more high-density layers 16H and the one or more low-density layers 16L may include a case in which both the number of the high-density layers 16H and the number of the low-density layers 16L are one, a case in which either one of the number of the high-density layers 16H and the number of the low-density layers 16L is two while the other is one, and a case in which both the number of the high-density layers 16H and the number of the low-density layers 16L are two.

In the present embodiment, the protecting film 16 is formed by the ALD method. Therefore, even when the protecting film 16 is formed in the state in which the particles 31 are adsorbed on the process target 23, the protecting film 16 is formed by the ALD method, and thus, the particles 31 are held by the protecting film 16 after the formation of the protecting film 16 because of the reasons described above with reference to FIG. 16, so that the dropping off of the particles 31 can be prevented. In the manner, the problem resulting from the dropping off of the particles 31 can be prevented, and therefore, the reliability of the organic EL element can be improved, and the reliability of the display apparatus (organic EL display apparatus) using the organic EL element can be improved. Also when the protecting film 16 is formed by the ALD method in the state in which the particles 31 are adsorbed on the process target 23, the same state shown in FIG. 16 is caused.

As described above, the inorganic insulating film is more difficult to allow the water to pass than the organic insulating film, and therefore, is suitable as the protecting film of the organic EL element, and thus, the inorganic insulating film is used as the protecting film 16. However, the inorganic insulating film is more rigid than the organic insulating film, and therefore, is easy to cause the cracks when bending.

In the present embodiment, when the flexible substrate is used as the substrate 11, it is desirable to improve the resistance property of the protecting film 16 against the bending so as not to cause the cracks in the protecting film 16 due to the bending. In order to achieve this, in the present embodiment, the protecting film 16 is adopted, the protecting film 16 having the layered structure made of the one or more high-density layers 16H and the one or more low-density layers 16L so that the low-density layer and the high-density layer are alternately layered so as to be in contact with each other. In the manner, the resistance property of the protecting film 16 against the bending can be improved, and the improvement will be described in detail below with reference to FIGS. 17 to 22. Note that the resistance property of the protecting film 16 against the bending corresponds to endurance of the protecting film 16 in a bending test. The bending test corresponds to a test that repeats a bending operation a plurality of times. If the problem such as the cracks is not caused on the protecting film 16 after the bending operation is repeated a plurality of times, it can be determined that the resistance property of the protecting film 16 against the bending is improved.

Each of FIGS. 17 to 22 is a cross-sectional view (explanatory diagram) showing a cross-sectional structure of the protecting film, and extracts and shows a part of the display apparatus 1 (a part of FIG. 3 described above). However, while FIGS. 17 to 20 and FIGS. 23 to 27 described later correspond to the present embodiment, FIGS. 21 and 22 correspond to a comparative example (a study example studied by the present inventors). FIGS. 17 to 22 show the cross-sectional structures of the protecting films (16, 116 and 216), and the cross-sectional structures of the protecting films are different from one another among FIGS. 17 to 22.

In FIGS. 17 to 22 and FIGS. 23 to 27 described later, a layer configuring a base of the protecting film (16, 116 or 216) is shown as a base layer 18 denoted with a symbol 18, and the protecting film (16, 116 or 216) is formed over the base layer 18. The base layer 18 is made of the above-described electrode layer 15, organic layer 14, electrode layer 13, passivation film 12 or substrate 11. Depending on a planar position of the protecting film, it may be determined by which one of the electrode layer 15, the organic layer 14, the electrode layer 13, the passivation film 12 and the substrate 11, the base layer 18 is made. For example, one protecting film 16 may uniformly have a region where the base layer 18 below the protecting film 16 is made of the electrode layer 15, a region where the base layer 18 below the protecting film 16 is made of the organic layer 14, a region where the base layer 18 below the protecting film 16 is made of the electrode layer 13, and a region where the base layer 18 below the protecting film 16 is made of the passivation layer 12.

The structure (cross-sectional structure) of the protecting film in each of FIGS. 17 to 22 is as follows.

Figure 17:
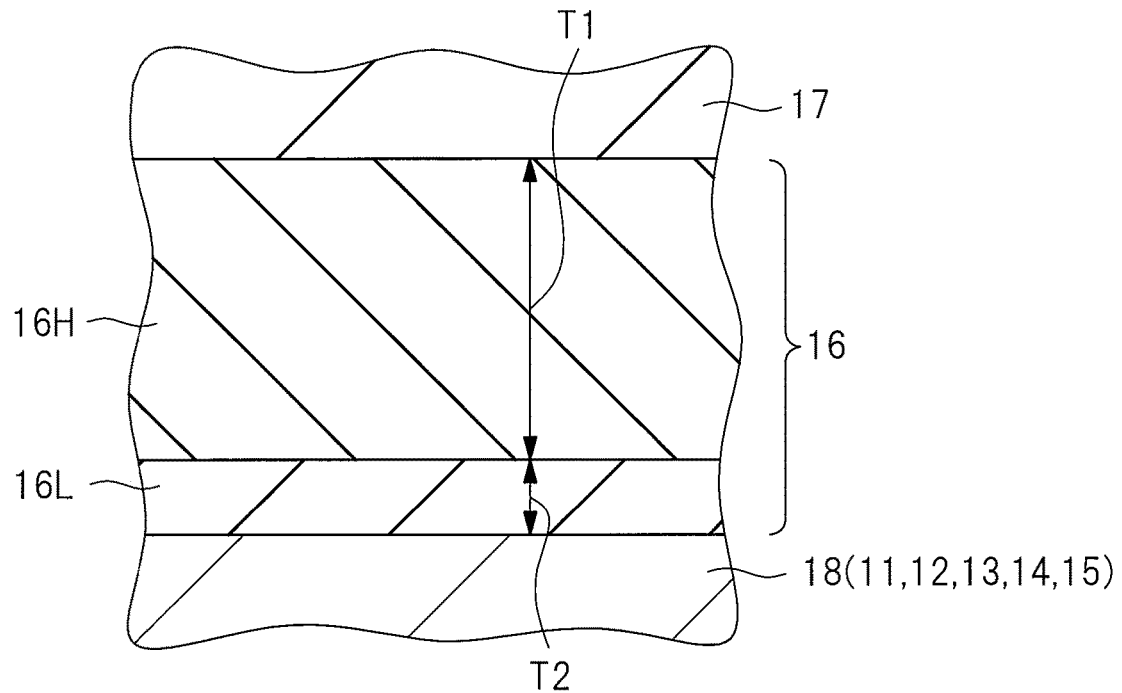
FIG. 17 is a cross-sectional view showing a cross-sectional structure of the protecting film.

That is, in the case of FIG. 17, the protecting film 16 is made of a layered film made of a low-density layer 16L serving as the lowermost layer and a high-density layer 16H serving as the uppermost layer formed over the low-density layer 16L. In other words, in the case of FIG. 17, the protecting film 16 has a layered structure made of a low-density layer 16L and a high-density layer 16H over the low-density layer 16L.

Figure 18:
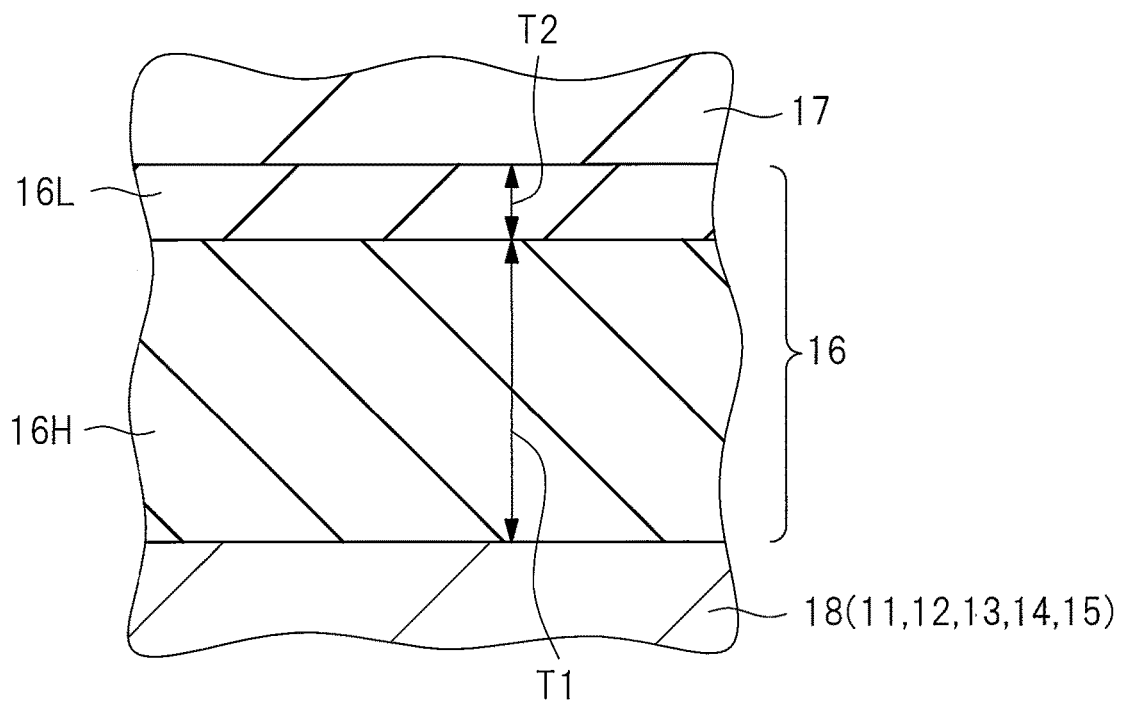
FIG. 18 is a cross-sectional view showing a cross-sectional structure of the protecting film.

In the case of FIG. 18, the protecting film 16 is made of a layered film made of a high-density layer 16H serving as the lowermost layer and a low-density layer 16L serving as the uppermost layer formed over the high-density layer 16H. In other words, in the case of FIG. 18, the protecting film 16 has a layered structure made of a high-density layer 16H and a low-density layer 16L over the high-density layer 16H.

Figure 19:
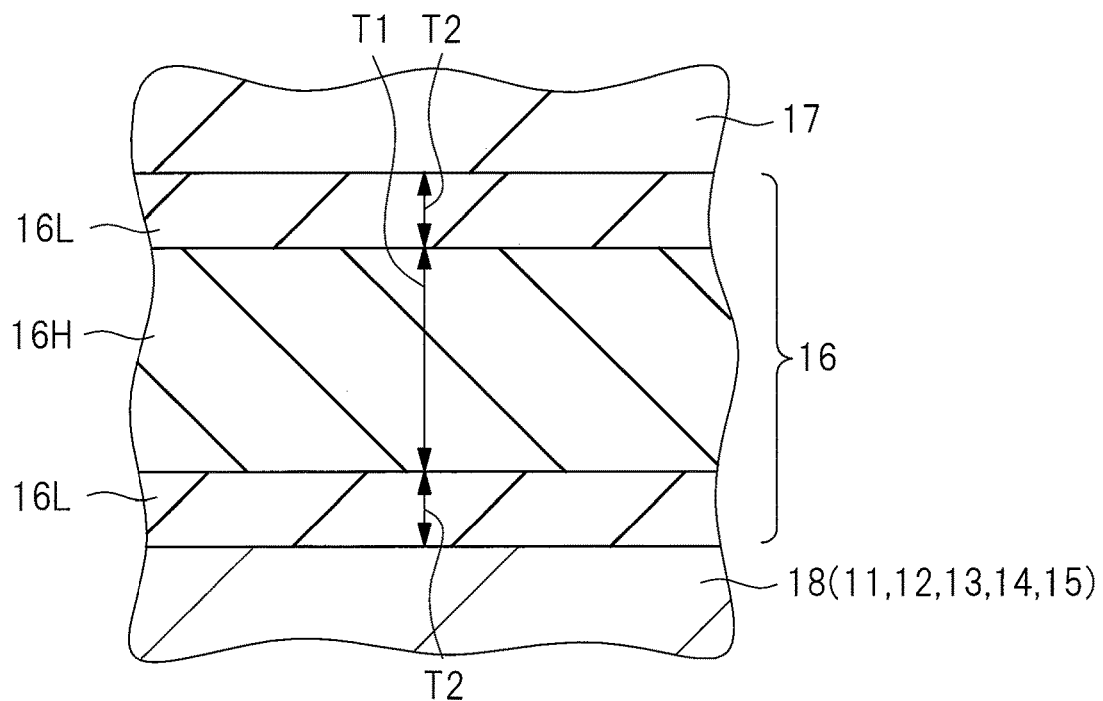
FIG. 19 is a cross-sectional view showing a cross-sectional structure of the protecting film.

In the case of FIG. 19, the protecting film 16 is made of a layered film made of a low-density layer 16L serving as the lowermost layer, a high-density layer 16H serving as a middle layer formed over the low-density layer 16L, and a low-density layer 16L serving as the uppermost layer formed over the high-density layer 16H. In other words, in the case of FIG. 19, the protecting film 16 has a layered structure made of a low-density layer 16L, a high-density layer 16H over the low-density layer 16L, and a low-density layer 16L over the high-density layer 16H.

Figure 20:
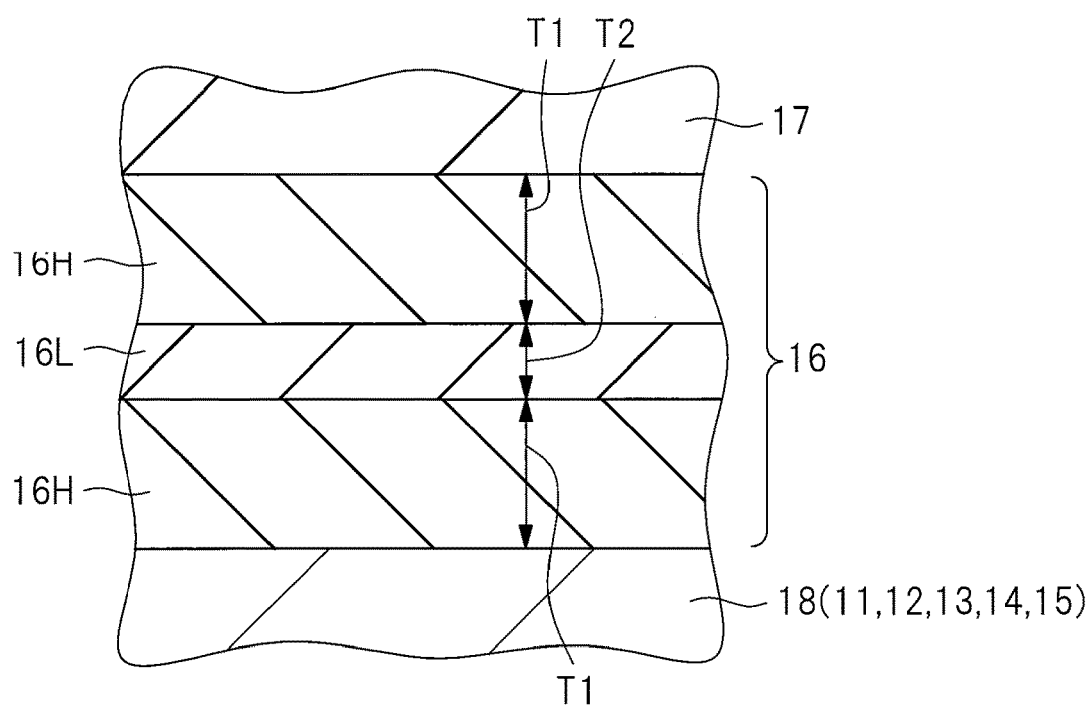
FIG. 20 is a cross-sectional view showing a cross-sectional structure of the protecting film.

In the case of FIG. 20, the protecting film 16 is made of a layered film made of a high-density layer 16H serving as the lowermost layer, a low-density layer 16L serving as a middle layer formed over the high-density layer 16H, and a high-density layer 16H serving as the uppermost layer formed over the low-density layer 16L. In other words, in the case of FIG. 20, the protecting film 16 has a layered structure made of a high-density layer 16H, a low-density layer 16L over the high-density layer 16H, and a high-density layer 16H over the low-density layer 16L. In other words, in the case of FIG. 20, the protecting film 16 has a structure in which the low-density layer 16L intermediates (is sandwiched) between two high-density layers 16H.

Figure 21:
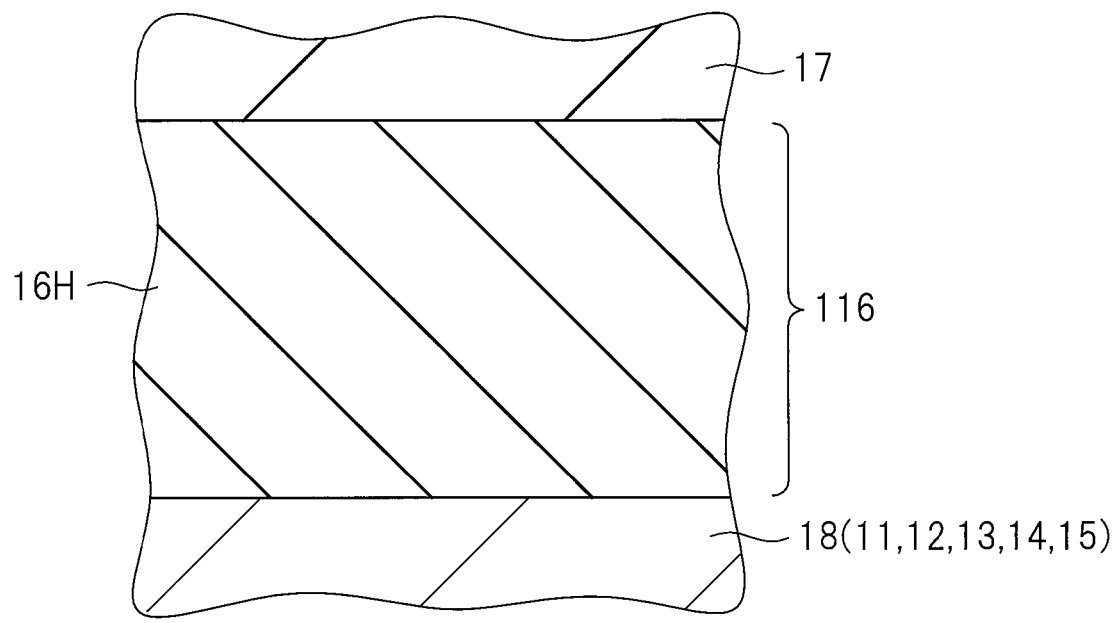
FIG. 21 is a cross-sectional view showing a cross-sectional structure of the protecting film.

FIG. 21 shows a cross-sectional view of the protecting film 16 of a first comparative example, and the protecting film 16 of the first comparative example is referred to as a "protecting film 116 of the first comparative example" or "protecting film 116" denoted with a symbol 116. The protecting film 116 of the first comparative example is made of a film having the same density as a whole as that of the high-density layer 16H. That is, in the case of FIG. 21, the protecting film 116 is made of the high-density layer 16H as a whole.

Figure 22:
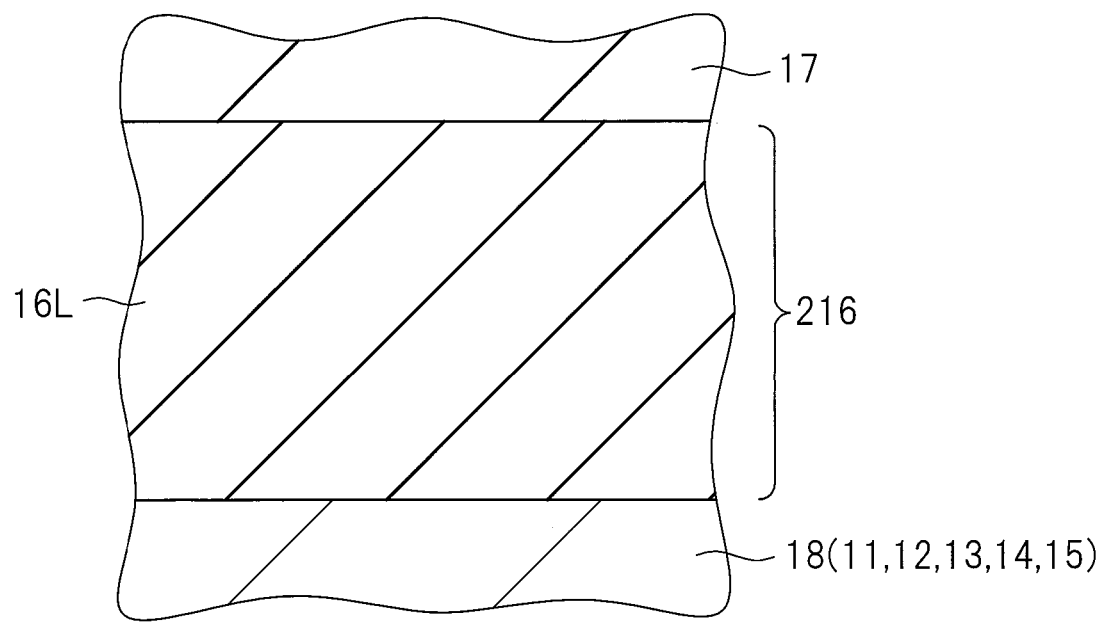
FIG. 22 is a cross-sectional view showing a cross-sectional structure of the protecting film.

FIG. 22 shows a cross-sectional view of the protecting film 16 of a second comparative example, and the protecting film 16 of the second comparative example is referred to as a "protecting film 216 of the second comparative example" or "protecting film 216" denoted with a symbol 216. The protecting film 216 of the second comparative example is made of a film having the same density as a whole as that of the low-density layer 16L. That is, in the case of FIG. 22, the protecting film 216 is made of the low-density layer 16L as a whole. In FIGS. 17 to 22, note that the thicknesses of the protecting films (16, 116 and 216) are the same as one another.

First, the protecting film 116 of the first comparative example shown in FIG. 21 is described. The protecting film 116 of the first comparative example shown in FIG. 21 is made of the high-density layer 16H as a whole. The high-density layer 16H has a high density, and therefore, is relatively a rigid film. Therefore, the protecting film 116 of the first comparative example shown in FIG. 21 is made of a rigid material as a whole. Therefore, the protecting film 116 of the first comparative example has a low resistance property against the bending, and has a risk of the occurrence of the cracks in the protecting film 116 due to the bending.

Next, the protecting film 216 of the second comparative example shown in FIG. 22 is described. The protecting film 216 of the second comparative example shown in FIG. 22 is made of the low-density layer 16L as a whole. The low-density layer 16L has a low density, and therefore, is a more flexible film than the high-density layer 16H. However, the low-density layer 16L has a lower density than that of the high-density layer 16H, and therefore, has a higher water permeability than that of the high-density layer 16H. That is, a barrier performance against the water is lower in the low-density layer 16L than the high-density layer 16H. Therefore, in the protecting film 216 of the second comparative example made of the low-density layer 16L as a whole, the barrier performance against the water is low, and there is a risk of reduction in a function serving as the water protecting film.

Next, an advantage of each case of FIGS. 17 to 20 is described.

First, the case of FIG. 17 is described. In the case of FIG. 17, the protecting film 16 has the layered structure made of the low-density layer 16L and the high-density layer 16H so that the lowermost layer is the low-density layer 16L. The base layer 18 below the protecting film 16 is made of the above-described electrode layer 15, organic layer 14, electrode layer 13, passivation layer 12 or others. When the lowermost layer of the protecting film 16 is made of a rigid film, stress is concentrated on a boundary between the protecting film 16 and the base layer 18 at the time of bending, depending on a material of the base layer 18 below the protecting film 16. Therefore, there are risks of occurrence of peeling off at the boundary between the protecting film 16 and the base layer 18 and the occurrence of the cracks in the protecting film 16 starting from the boundary as a point of origin. On the other hand, in the case of FIG. 17, the lowermost layer of the protecting film 16 is made of the low-density layer 16L having more flexibility than that of the high-density layer 16H. Therefore, even if the stress is concentrated on the boundary between the protecting film 16 and the base layer 18 at the time of bending, the stress on the boundary can be absorbed by the low-density layer 16L having the flexibility. Therefore, in the case of FIG. 17, since the lowermost layer of the protecting film 16 is made of the low-density layer 16L, the peeling off at the boundary between the protecting film 16 and the base layer 18 and the occurrence of the cracks in the protecting film 16 starting from the boundary as the point of origin at the time of bending can be suppressed or prevented. Therefore, the reliability of the protecting film 16 can be improved, and thus, the reliability of the display apparatus can be improved. An optional range of the material for the film (the above-described electrode layer 15, organic layer 14, electrode layer 13, passivation film 12 or others) that can be the base layer 18 of the protecting film 16 is widened, and therefore, it is easy to manufacture the organic EL element and the organic EL display apparatus, and performances of the organic EL element and the organic EL display apparatus can be improved.

In the case of FIG. 17, the protecting film 16 includes the high-density layer 16H having the higher barrier performance against the water (that is, the lower water permeability) than that of the low-density layer 16L, and the barrier performance of the protecting film 16 against the water can be secured by this high-density layer 16H. Therefore, the function serving as the water protecting film of the protecting film 16 can be secured.

Next, the case of FIG. 18 is described. In the case of FIG. 18, the protecting film 16 has the layered structure made of the high-density layer 16H and the low-density layer 16L so that the uppermost layer is the low-density layer 16L. When any film (in this case, the insulating film 17) is formed over the protecting film 16, stress is concentrated on a boundary between the protecting film 16 and the film over the protecting film at the time of bending, depending on a material of the film, and therefore, there are risks of the occurrence of peeling off at the boundary between the protecting film 16 and the film over the protecting film and the occurrence of the cracks in the protecting film 16 starting from the boundary as a point of origin. On the other hand, in the case of FIG. 18, the uppermost layer of the protecting film 16 is made of the low-density layer 16L having more flexibility than that of the high-density layer 16H. Therefore, even if the stress is concentrated on the boundary between the protecting film 16 and the film over the protecting film at the time of bending, the stress on the boundary can be absorbed by the low-density layer 16L having the flexibility. Therefore, in the case of FIG. 18, since the uppermost layer of the protecting film 16 is made of the low-density layer 16L, the peeling off at the boundary between the protecting film 16 and the film over the protecting film and the occurrence of the cracks in the protecting film 16 starting from the boundary as the point of origin at the time of bending can be suppressed or prevented. Therefore, the reliability of the protecting film 16 can be improved, and thus, the reliability of the display apparatus can be improved. An optional range of the material for the film formed over the protecting film 16 is widened, and therefore, it is easy to manufacture the organic EL display apparatus, and performances of the organic EL display apparatus can be improved.

Also in the case of FIG. 18, the protecting film 16 includes the high-density layer 16H having the higher barrier performance against the water (that is, the lower water permeability) than that of the low-density layer 16L, and the barrier performance of the protecting film 16 against the water can be secured by this the high-density layer 16H. Therefore, the function serving as the water protecting film of the protecting film 16 can be secured.

Next, the case of FIG. 19 is described. In the case of FIG. 19, the protecting film 16 has the layered structure made of the low-density layer 16L, the high-density layer 16H and the low-density layer 16L so that the lowermost layer is the low-density layer 16L and so that the uppermost layer is the low-density layer 16L. In the manner, the case of FIG. 19 can obtain both effects (advantages) described with reference to FIG. 17 and effects (advantages) described with reference to FIG. 18.

Also in the case of FIG. 19, the protecting film 16 includes the high-density layer 16H having the higher barrier performance against the water (that is, the lower water permeability) than that of the low-density layer 16L, and the barrier performance of the protecting film 16 against the water can be secured by this high-density layer 16H. Therefore, the function serving as the water protecting film of the protecting film 16 can be secured.

Next, the case of FIG. 20 is described. In the case of FIG. 20, the protecting film 16 has the layered structure made of the high-density layer 16H, the low-density layer 16L and the high-density layer 16H so as to have a structure in which the low-density layer 16L intermediates (is sandwiched) between the two high-density layers 16H. When the high-density layer 16H is thick, stress is generated inside the high-density layer 16H at the time of bending, and therefore, there is a risk of the occurrence of the cracks inside the high-density layer 16H due to the stress. Therefore, in the case of the protecting film 116 of the first comparative example shown in FIG. 21 made of the high-density layer 16H as a whole, the high-density layer 16H is thick, and thus, stress is generated inside the protecting film 116 at the time of bending, and therefore, there is a risk of the occurrence of the cracks inside the protecting film 116 due to the stress. On the other hand, in the case of FIG. 20, while one thick high-density layer 16H is not used, the one thick high-density layer 16H is separated into two high-density layers 16H between which the low-density layer 16L intermediates. Therefore, in the case of FIG. 20, the stress generated inside each high-density layer 16H can be suppressed since each high-density layer 16H can be thinned, and the low-density layer 16L having the flexibility can absorb the stress since the low-density layer 16L intermediates between two high-density layers 16H. Therefore, in the case of FIG. 20, since the low-density layer 16L intermediates between two high-density layers 16H in the protecting film 16, the occurrence of the cracks inside the protecting film 16 at the time of bending can be suppressed or prevented. Therefore, the reliability of the protecting film 16 can be improved, and thus, the reliability of the display apparatus can be improved.

Also in the case of FIG. 20, the protecting film 16 includes the high-density layer 16H having the higher barrier performance against the water (that is, the lower water permeability) than that of the low-density layer 16L, and the barrier performance of the protecting film 16 against the water can be secured by this the high-density layer 16H. Therefore, the function serving as the water protecting film of the protecting film 16 can be secured.

All the cases of FIGS. 17 to 20 are common in that the protecting film 16 has the layered structure made of the one or more high-density layers 16H and the one or more low-density layers 16L having a lower density than that of the high-density layer 16H so that the low-density layer 16L and the high-density layer 16H are alternately layered so as to be in contact with each other. A feature of the case of FIG. 17 is described so that the lowermost layer of the protecting film 16 is the low-density layer 16L, and is referred to as a first condition. A feature of the case of FIG. 18 is described so that the uppermost layer of the protecting film 16 is the low-density layer 16L, and is referred to as a second condition. A feature of the case of FIG. 19 is described so that the lowermost layer of the protecting film 16 is the low-density layer 16L as well as the uppermost layer of the protecting film 16 is the low-density layer 16L, and satisfies both the first and second conditions. A feature of the case of FIG. 20 is described so that the protecting film 16 includes a pair of (two) high-density layers 16H sandwiching the low-density layer 16L therebetween, and is referred to as a third condition. In other words, it can be also said that the third condition means that the protecting film 16 includes the two high-density layers 16H and the low-density layer 16L intermediating between the two high-density layers 16H.

The protecting film 116 of the first comparative example shown in FIG. 21 is made of the high-density layer 16H as a whole, and therefore, there is a risk of the following three problems. That is, as a first problem, stress is concentrated on a boundary between the protecting film 116 and a base of the protecting film 116 at the time of bending, and therefore, there are risks of the peeling off at the boundary between the protecting film 116 and the base of the protecting film 116 and the occurrence of the cracks in the protecting film 116 starting from the boundary as a point of origin. As a second problem, there are risks of peeling off at the boundary between the protecting film 116 and a film over the protecting film 116 and the occurrence of the cracks in the protecting film 116 starting from the boundary as a point of origin at the time of bending. As a third problem, there is a risk of occurrence of the cracks inside the protecting film 116 due to the stress inside the protecting film 116 at the time of bending.

On the other hand, the cases of FIGS. 17 and 19 satisfy the first condition so that the lowermost layer of the protecting film 16 is the low-density layer 16L, and therefore, this low-density layer 16L can be functioned as a buffer layer (stress buffer layer, stress moderating layer) between the protecting film 16 and the base layer 18. In this manner, the first problem can be remedied. The cases of FIGS. 18 and 19 satisfy the second condition so that the uppermost layer of the protecting film 16 is the low-density layer 16L, and therefore, this low-density layer 16L can be functioned as a buffer layer (stress buffer layer, stress moderating layer) between the protecting film 16 and the film over the protecting film 16. In this manner, the second problem can be remedied. The case of FIG. 20 satisfies the third condition so that the low-density layer 16L intermediates between the two high-density layers 16H, and this structure corresponds to a structure in which the low-density layer 16L is inserted into the high-density layers 16H (is at the middle of the thickness of the high-density layers 16H). In the case of FIG. 20, the low-density layer 16L is inserted into (at the middle of the thickness of) the high-density layers 16H, and this low-density layer 16L can be functioned as a buffer layer (stress buffer layer, stress moderating layer). In this manner, the stress inside the high-density layer 16H can be moderated, and the third problem can be remedied. In all the cases of FIGS. 17 to 20, the protecting film 16 has one or more high-density layers 16H, and therefore, the cases can ensure the function serving as the water protecting film of the protecting film 16. Note that the improvement of any of the first, second and third problems leads to improvement of the reliability of the protecting film 16, and thus, leads to the improvement of the reliability of the display apparatus.

The layered structure of the protecting film 16 is applicable to not only the cases of FIGS. 17 to 20 but also other cases, and the application examples of the cases are shown in FIGS. 23 to 27. Each of FIGS. 23 to 27 is a cross-sectional view (explanatory diagram) showing a cross-sectional structure of the protecting film 16, and corresponds to the FIGS. 17 to 22 described above.

Figure 23:
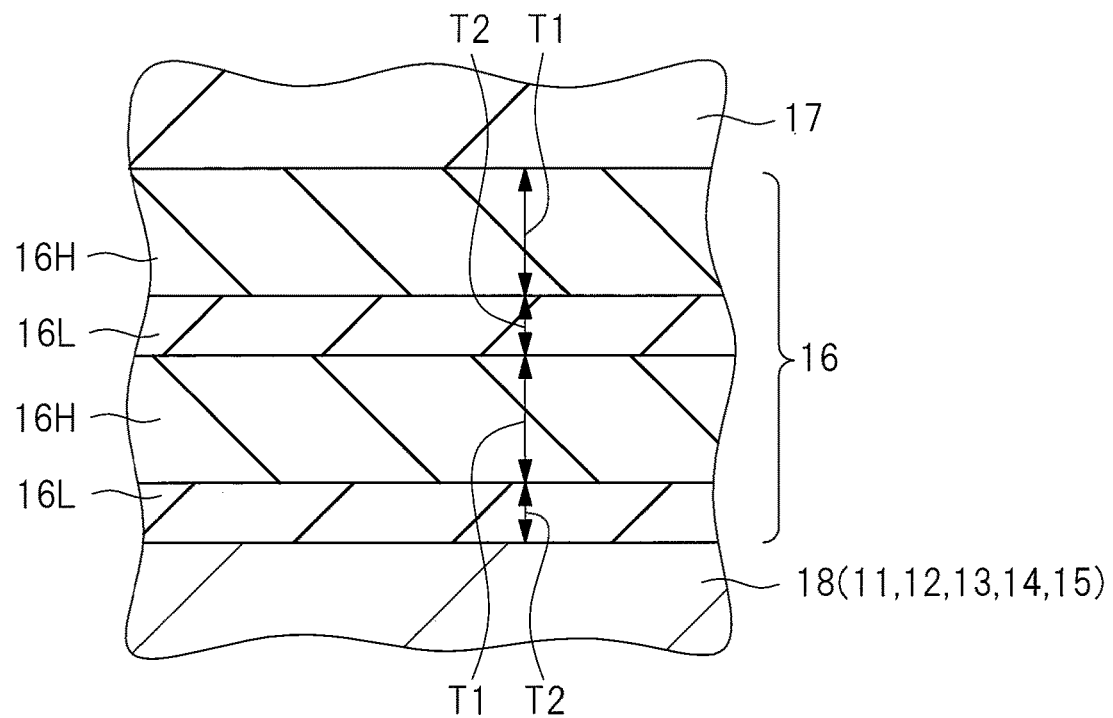
FIG. 23 is a cross-sectional view showing a cross-sectional structure of the protecting film.

In the case of FIG. 23, the protecting film 16 has a layered structure in which the low-density layer 16L, the high-density layer 16H, the low-density layer 16L and the high-density layer 16H are layered in this order from below upward. The protecting film 16 of FIG. 23 corresponds to a case in which the low-density layer 16L is added as the lowermost layer below the lower high-density layer 16H of the protecting film 16 of FIG. 20. That is, FIG. 23 corresponds to a case in which the feature of FIG. 17 (the first condition) is added to the protecting film 16 of FIG. 20 (the protecting film 16 satisfying the third condition). The case of FIG. 23 satisfies the first and third conditions, and therefore, the first and third problems can be remedied, and the effect described with reference to FIG. 17 and the effect described with reference to FIG. 20 can be obtained.

Figure 24:
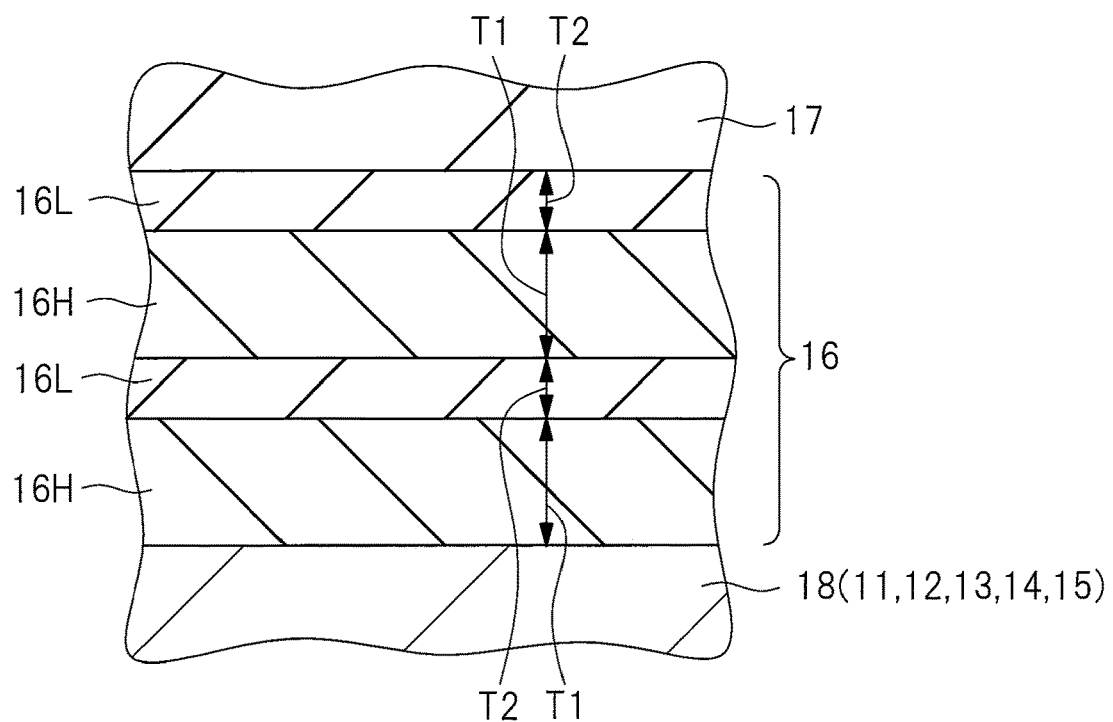
FIG. 24 is a cross-sectional view showing a cross-sectional structure of the protecting film.

In the case of FIG. 24, the protecting film 16 has a layered structure in which the high-density layer 16H, the low-density layer 16L, the high-density layer 16H and the low-density layer 16L are layered in this order from below upward. The protecting film 16 of FIG. 24 corresponds to a case in which the low-density layer 16L is added as the uppermost layer above the upper high-density layer 16H of the protecting film 16 of FIG. 20. That is, FIG. 24 corresponds to a case in which the feature of FIG. 18 (the second condition) is added to the protecting film 16 of FIG. 20 (the protecting film 16 satisfying the third condition). The case of FIG. 24 satisfies the second and third conditions, and therefore, the second and third problems can be remedied, and the effect described with reference to FIG. 18 and the effect described with reference to FIG. 20 can be obtained.

Figure 25:
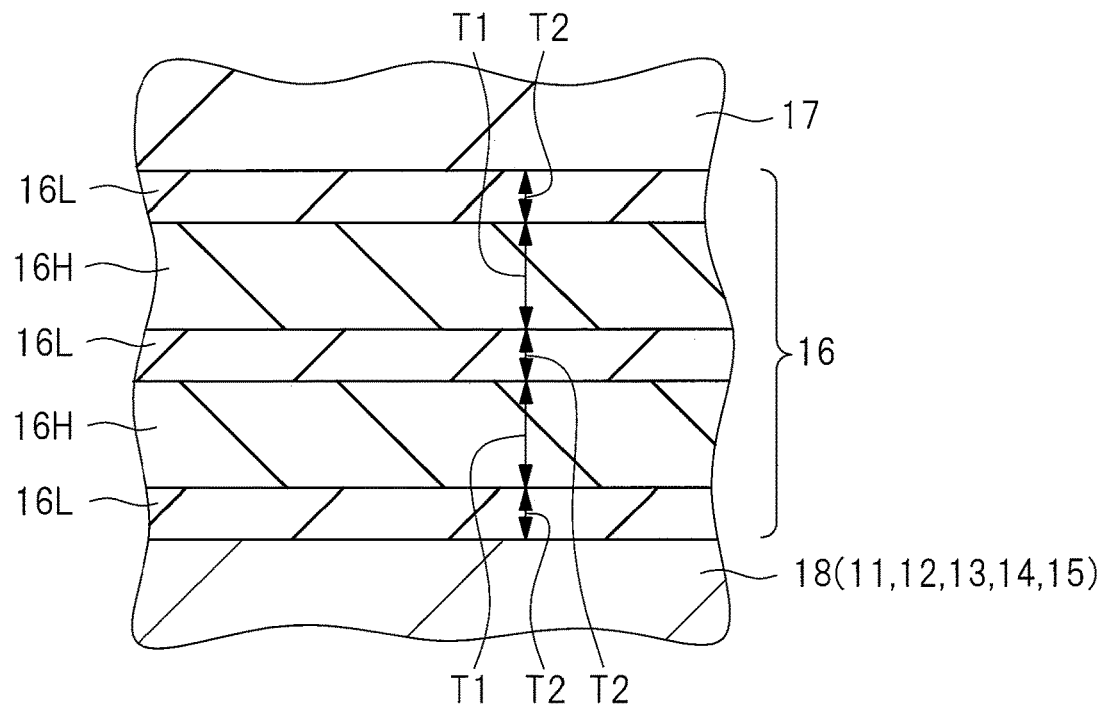
FIG. 25 is a cross-sectional view showing a cross-sectional structure of the protecting film.

In the case of FIG. 25, the protecting film 16 has a layered structure in which the low-density layer 16L, the high-density layer 16H, the low-density layer 16L, the high-density layer 16H and the low-density layer 16L are layered in this order from below upward. The protecting film 16 of FIG. 25 corresponds to a case in which the low-density layer 16L is added as the lowermost layer below the lower high-density layer 16H of the protecting film 16 of FIG. 20 as well as the low-density layer 16L is added as the uppermost layer above the upper high-density layer 16H thereof. That is, FIG. 25 corresponds to a case in which the feature of FIG. 17 (the first condition) and the feature of FIG. 18 (the second condition) are added to the protecting film 16 of FIG. 20 (the protecting film 16 satisfying the third condition). The case of FIG. 25 satisfies the first, second and third conditions, and therefore, the first, second and third problems can be remedied, and the effect described with reference to FIG. 17, the effect described with reference to FIG. 18 and the effect described with reference to FIG. 20 can be obtained.

Figure 26:
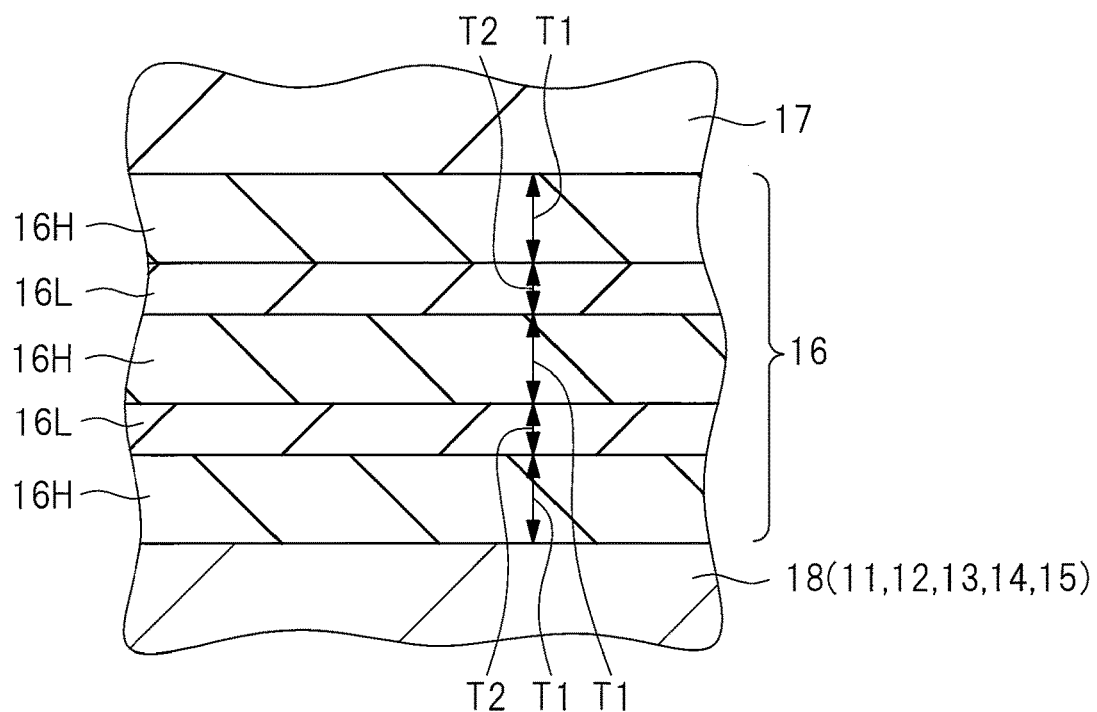
FIG. 26 is a cross-sectional view showing a cross-sectional structure of the protecting film.
Figure 27:
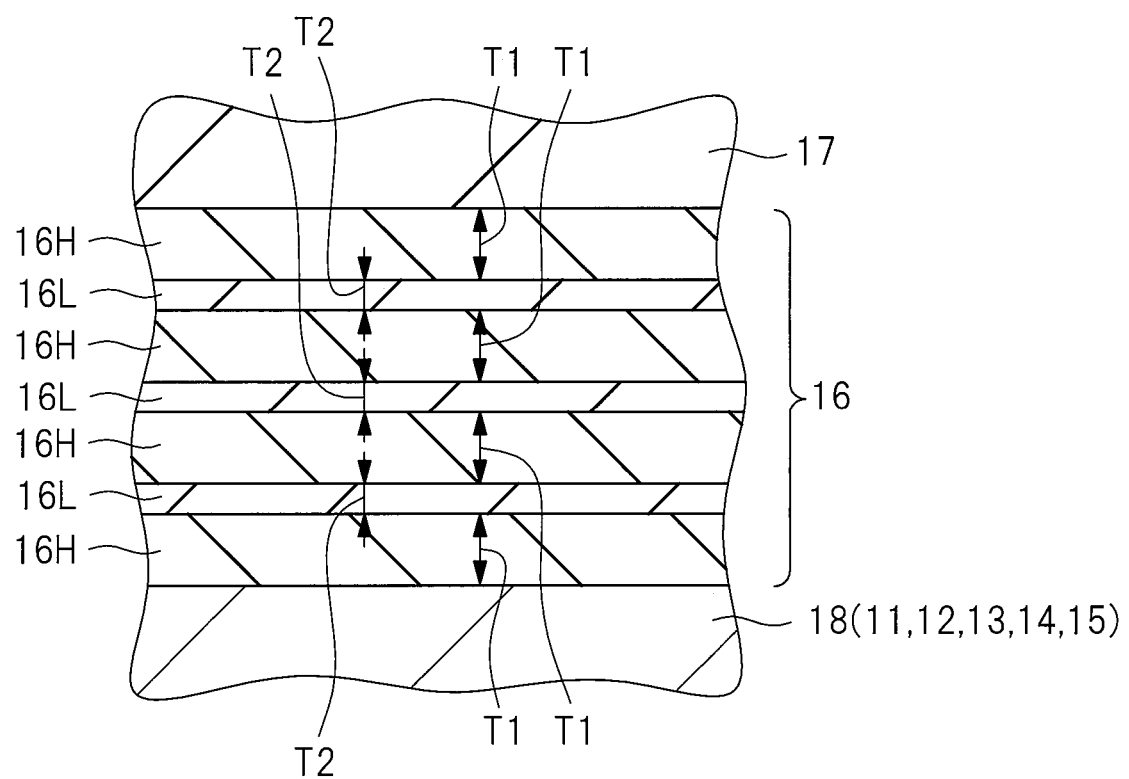
FIG. 27 is a cross-sectional view showing a cross-sectional structure of the protecting film.

In the case of FIG. 26, the protecting film 16 has a layered structure in which the high-density layer 16H, the low-density layer 16L, the high-density layer 16H, the low-density layer 16L and the high-density layer 16H are layered in this order from below upward. In the case of FIG. 27, the protecting film 16 has a layered structure in which the high-density layer 16H, the low-density layer 16L, the high-density layer 16H, the low-density layer 16L, the high-density layer 16H, the low-density layer 16L and the high-density layer 16H are layered in this order from below upward.

Both the protecting film 16 of FIG. 26 and the protecting film 16 of FIG. 27 are modified examples of the protecting film 16 of FIG. 20. In the case of FIG. 20, the structure in which one low-density layer 16L is inserted into (at the middle of the thickness of) the high-density layers 16H is applied to the protecting film 16. In the case of FIG. 26, a structure in which two low-density layers 16L are inserted into (at the middle of the thickness of) the high-density layers 16H is applied to the protecting film 16. In the case of FIG. 27, a structure in which three low-density layers 16L are inserted into (at the middle of the thickness of) the high-density layers 16H is applied to the protecting film 16.

Also in the cases of FIGS. 26 and 27, the similar effects as those of the case of FIG. 20 can be obtained. That is, when the high-density layer 16H is thick, stress is generated inside the high-density layer 16H at the time of bending, and therefore, there is a risk of the occurrence of the cracks inside the high-density layer 16H due to the stress. Therefore, in the case of the protecting film 116 of the first comparative example shown in FIG. 21 made of the high-density layer 16H as a whole, the high-density layer 16H is thick, and thus, stress is generated inside the protecting film 116 at the time of bending, and therefore, there is a risk of the occurrence of the cracks inside the protecting film 116 due to the stress. On the other hand, in the case of FIG. 26, while one thick high-density layer 16H is not used, the one thick high-density layer 16H is separated into three high-density layers 16H between each of which the low-density layer 16L intermediates. In the case of FIG. 27, while one thick high-density layer 16H is not used, the one thick high-density layer 16H is separated into four high-density layers 16H between each of which the low-density layer 16L intermediates. Therefore, in the cases of FIGS. 26 and 27, the stress generated inside each high-density layer 16H can be suppressed since each high-density layer 16H can be thinned, and the low-density layer 16L having the flexibility can absorb the stress since the low-density layer 16L (buffer layer) intermediates between the high-density layers 16H. Also in the cases of FIGS. 26 and 27, the occurrence of the cracks inside the protecting film 16 at the time of bending can be suppressed or prevented.

In comparison among the cases of FIGS. 20, 26 and 27, even if the protecting film 16 is not thinned, the individual high-density layer 16H can be thinner in the case of FIG. 26 than the case of FIG. 20, and in the case of FIG. 27 than the case of FIG. 26. Therefore, the effect capable of suppressing or preventing the occurrence of the cracks inside the protecting film 16 at the time of bending is larger in the case of FIG. 26 than the case of FIG. 20, and in the case of FIG. 27 than the case of FIG. 26. On the other hand, in comparison among the cases of FIGS. 20, 26 and 27, if the thicknesses of these protecting films 16 are the same as one another, a total thickness of the low-density layers 16L is larger in the case of FIG. 26 than the case of FIG. 20, and in the case of FIG. 27 than the case of FIG. 26. Therefore, in an attempt to increase the barrier performance of the protecting film 16 against the water as high as possible, that is, decrease the lower water permeability of the protecting film 16 as low as possible, the case of FIG. 26 is more advantage than the case of FIG. 27, and the case of FIG. 20 is still more advantage than the case of FIG. 26.

As a further modified example of the protecting film 16 in FIGS. 20, 26 and 27, a structure in which four or more low-density layers 16L are inserted into (at the middle of the thickness of) the high-density layers 16H is also applied to the protecting film 16.

In comprehensive consideration for each protecting film 16 in FIGS. 20, 26 and 27, the following fourth condition is applicable in place of the third condition. That is, as the fourth condition, the protecting film 16 (the layered structure configuring the protecting film 16) includes a plurality of high-density layers 16H and a low-density layer 16L intermediating between the plurality of high-density layers 16H. That is, when the protecting film 16 includes the plurality of high-density layers 16H between which the low-density layer 16L intermediates, the fourth condition is satisfied. The protecting films 16 in FIGS. 20, 23, 24, 25, 26 and 27 satisfy the fourth condition. When the third condition is satisfied, the fourth condition is necessarily satisfied.

That is, in the cases of 20, 23, 24 and 25, the protecting film 16 includes two high-density layers 16H and the low-density layer 16L intermediating between the two high-density layers 16H to satisfy the fourth condition. In the cases of 26, the protecting film 16 includes three high-density layers 16H and the low-density layers 16L intermediating among the three high-density layers 16H to satisfy the fourth condition. In the cases of 27, the protecting film 16 includes four high-density layers 16H and the low-density layers 16L intermediating among the four high-density layers 16H to satisfy the fourth condition. The number of the high-density layers 16H included in the protecting film 16 may be five or larger. Also in this case, the low-density layers 16L intermediate among the five or more high-density layers 16H, and therefore, the fourth condition is satisfied. When the fourth condition is satisfied, each high-density layer 16H can be thinned, and therefore, the stress generated inside each high-density layer 16H can be suppressed. And, the low-density layer 16L having the flexibility can absorb the stress since the low-density layer 16L intermediates between the high-density layers 16H that are adjacent to each other in up and down directions. In this manner, the occurrence of the cracks inside the protecting film 16 at the time of bending can be suppressed or prevented.

Although not illustrated, in the protecting film 16 in FIG. 26 and the protecting film 16 in FIG. 27, the low-density layer 16L can be also added as the lowermost layer below the lower high-density layer 16H so that the first condition is satisfied. In the protecting film 16 in FIG. 26 and the protecting film 16 in FIG. 27, the low-density layer 16L can be also added as the uppermost layer above the upper high-density layer 16H so that the second condition is satisfied. In the protecting film 16 in FIG. 26 and the protecting film 16 in FIG. 27, the low-density layer 16L can be also added as the lowermost layer below the lower high-density layer 16H as well as the low-density layer 16L can be also added as the uppermost layer above the upper high-density layer 16H so that the first and second conditions are satisfied. Also in the protecting film 16 in FIG. 26 and the protecting film 16 in FIG. 27, when the first condition is satisfied, the first problem is remedied, so that the effect described with reference to FIG. 17 can be obtained. When the second condition is satisfied, the second problem is remedied, so that the effect described with reference to FIG. 18 can be obtained.

When the protecting film 16 has the layered structure made of the one or more high-density layers 16H and the one or more low-density layers 16L so that the low-density layer 16L and the high-density layer 16H are alternately layered so as to be in contact with each other, note that one or more of the first condition, the second condition and the fourth condition is satisfied. For example, when the number of the high-density layer 16H included in the protecting film 16 is one, either one or both of the first condition and the second condition are necessarily satisfied while the fourth condition is not satisfied. When the number of the high-density layer 16H included in the protecting film 16 is two or more, the fourth condition is necessarily satisfied.

A density of the low-density layer 16L is lower than a density of the high-density layer 16H. In other words, the density of the high-density layer 16H is higher than the density of the low-density layer 16L. In this manner, the barrier performance against the water is secured by the high-density layer 16H having the high density, and the low-density layer 16L having the low density can be functioned as the buffer layer (stress buffer layer, stress moderating layer). In consideration of such functions of the high-density layer 16H and the low-density layer 16L, it is preferable to make some difference between the density of the high-density layer 16H and the density of the low-density layer 16L. More specifically, it is preferable to make the density of the low-density layer 16L to be equal to or lower than 95% of the density of the high-density layer 16H. That is, when it is assumed that the density of the low-density layer 16L is "α1" while the density of the high-density layer 16H is "α2", it is preferable to establish a relation of "α1/α2≤0.95".

When the density of the low-density layer 16L is too low, stability of the low-density layer 16L is low. Therefore, it is preferable to make the density of the low-density layer 16L to be equal to or higher than 80% of the density of the high-density layer 16H, more preferable to make the density of the low-density layer 16L to be equal to or higher than 90% of the density of the high-density layer 16H. That is, when it is assumed that the density of the low-density layer 16L is "α1" while the density of the high-density layer 16H is "α2", it is preferable to establish a relation of "α1/α2≥0.8", more preferable to establish a relation of "α1/α2≥0.9".

Therefore, it is preferable to make the density of the low-density layer 16L to be equal to or lower than 95% as well as being equal to or higher than 80% of the density of the high-density layer 16H (that is, 0.8≤α1/α2≤0.95), more preferable to make the density of the low-density layer 16L to be equal to or lower than 95% as well as being equal to or higher than 90% of the density of the high-density layer 16H (that is, 0.9≤α1/α2≤0.95).

Since the barrier performance of the protecting film 16 against the water is mainly secured by the high-density layer 16H, it is preferable to make the density of the high-density layer 16H to be as high as possible. Therefore, it is preferable to make the high-density layer 16H to be nearly a film having an ideal crystal structure with less deficiency (hole). In this viewpoint, when each of the high-density layer 16H and the low-density layer 16L is made of aluminum oxide ($Al_2O_3$), it is preferable to make the density of the high-density layer 16H to be equal to or larger than 3.0 g/cm³. When each of the high-density layer 16H and the low-density layer 16L is made of silicon oxide ($SiO_2$), it is preferable to make the density of the high-density layer 16H to be equal to or larger than 2.2 g/cm³. When each of the high-density layer 16H and the low-density layer 16L is made of silicon nitride (SiN), it is preferable to make the density of the high-density layer 16H to be equal to or larger than 2.2 g/cm³. When each of the high-density layer 16H and the low-density layer 16L is made of titanium oxide ($TiO_2$), it is preferable to make the density of the high-density layer 16H to be equal to or larger than 3.1 g/cm³. When each of the high-density layer 16H and the low-density layer 16L is made of zirconium oxide ($ZrO_2$), it is preferable to make the density of the high-density layer 16H to be equal to or larger than 5.2 g/cm³.

In the protecting film 16, it is preferable to make the high-density layer 16H to be thicker than the low-density layer 16L. The reason is described as follows.

That is, the barrier performance of the high-density layer 16H against the water is higher than that of the low-density layer 16L. Therefore, water permeability per unit thickness of the high-density layer 16H is lower than that of the low-density layer 16L. Accordingly, in the present embodiment, it is preferable to make the high-density layer 16H to be thicker than the low-density layer 16L. That is, in the thickness of the protecting film 16, it is preferable to make an allocated thickness of each of the high-density layers 16H to be larger than an allocated thickness of each of the low-density layers 16L. In the high-density layer 16H and the low-density layer 16L, when the high-density layer 16H having the low water permeability per unit thickness is made thicker while the low-density layer 16L having the higher water permeability per unit thickness than that of the high-density layer 16H is made thinner, the water permeability of the protecting film 16 per unit thickness can be decreased, and the effect capable of preventing the infiltration of the water by the protecting film 16 can be enhanced. In the manner, the function serving as the water protecting film of the protecting film 16 can be enhanced, and the effect capable of preventing the infiltration of the water by the protecting film 16 can be efficiently obtained.

That is, it is assumed that the thickness of the protecting film 16 is constant. In this case, when the low-density layer 16L is made thick while the high-density layer 16H is made thin by the increase in the thickness of the low-density layer 16L, the water permeability of the protecting film 16 as a whole is undesirably increased since the small thickness of the high-density layer 16H having the low water permeability per unit thickness is reflected. On the other hand, when the low-density layer 16L is made thin while the high-density layer 16H is made thick by the decrease in the thickness of the low-density layer 16L, the water permeability of the protecting film 16 as a whole can be decreased since the large thickness of the high-density layer 16H having the low water permeability per unit thickness is reflected. Therefore, in order to efficiently enhance the effect capable of preventing the infiltration of the water by the protecting film 16, it is effective to make the low-density layer 16L to be thin and make the high-density layer 16H to be thick by the decrease in the thickness of the low-density layer 16L. Thus, in the thickness of the protecting film 16, it is preferable to make the allocated thickness of each of the high-density layers 16H to be larger than the allocated thickness of each of the low-density layers 16L so that the high-density layer 16H is thicker than the low-density layer 16L. In FIGS. 17 to 20 and 23 to 27, the thickness of the high-density layer 16H is shown as a thickness "T1" denoted with a symbol T1 while the thickness of the low-density layer 16L is shown as a thickness "T2" denoted with a symbol T2, and it is preferable to establish a relation of "T1>T2". In the protecting film 16, while it is preferable to make the high-density layer 16H to be thicker than the low-density layer 16L (T1>T2), it is more preferable to make the thickness of the high-density layer 16H to be twice or more the thickness of the low-density layer 16L (T1≥T2×2).

In order to make the high-density layer 16H to be thicker than the low-density layer 16L, the number of times of the cycle made of the first to fourth steps for the formation of the high-density layer 16H may be larger than the number of times of the cycle made of the first to fourth steps for the formation of the low-density layer 16L. When the number of times of the cycle made of the first to fourth steps for the formation of the high-density layer 16H is twice or more the number of times of the cycle made of the first to fourth steps for the formation of the low-density layer 16L, the thickness of the high-density layer 16H is to be twice or more the thickness of the low-density layer 16L.

In the protecting film 16, it is preferable to make the high-density layer 16H to be thicker than the low-density layer 16L. However, when the low-density layer 16L is too thin, the function of the low-density layer 16L serving as the buffer layer is reduced, and there is a risk of reduction in the effect capable of suppressing or preventing the occurrence of the cracks in the protecting film 16 at the time of bending. Therefore, the thickness of the low-density layer 16L is preferably equal to or larger than 2 nm. By this technique, it is easy to secure the function of the low-density layer 16L serving as the buffer layer (stress buffer layer, stress moderating layer), and the effect capable of suppressing or preventing the occurrence of the cracks in the protecting film 16 at the time of bending can be reliably obtained. For example, in order to make the low-density layer 16L having the thickness that is equal to or larger than 2 nm when the low-density layer 16L is made of aluminum oxide, about 13 or more cycles each made of the first to fourth steps may be performed to form the low-density layer 16L.

In order to hold the particles 31 by using the protecting film 16 to reliably prevent the dropping off of the particles 31, it is preferable to make the protecting film 16 to be thick to some extent. More specifically, it is preferable to make the thickness of the protecting film 16 to be equal to or larger than 20 nm.

The large thickness of the protecting film leads to the increase in the risk of the occurrence of the cracks in the protecting film at the time of bending. However, in the present embodiment, by the devisal for the layered structure of the protecting film 16 as described above, the occurrence of the cracks in the protecting film 16 at the time of bending can be suppressed or prevented. Therefore, even when the flexible substrate is used as the substrate 11, and besides, even when the thickness of the protecting film 16 is equal to or larger than about 100 nm, the resistance property of the protecting film 16 against the bending can be secured by the application of the protecting film 16 of the present embodiment, and the occurrence of the cracks in the protecting film 16 due to the bending can be suppressed or prevented. Therefore, when the protecting film 16 is thick, that is, when the thickness of the protecting film 16 is equal to or larger than 100 nm, the application of the present embodiment offers the extremely-large effect. When the thickness of the protecting film 16 is equal to or larger than 100 nm, the dropping off of the particles 31 can be reliably prevented by the protecting film 16 even if the diameter of each of the particles 31 is equal to or larger than about 1 µm.

The protecting film 16 is formed by the ALD method, that is, both the high-density layer 16H and the low-density layer 16L configuring the protecting film 16 are formed by the ALD method. The reason why the ALD method is used is as described in the section "Background on Study" with reference to FIGS. 14 to 16. Since the organic EL element (particularly the organic layer 14) is weak against the high temperature, it is preferable to set a film-forming temperature of the protecting film 16, that is, each film-forming temperature of the high-density layer 16H and the low-density layer 16L to be relatively low so as not to adversely affect the organic EL element (particularly the organic layer 14). More specifically, it is preferable to set the temperature to be equal to or lower than 100° C., and, for example, about 80° C. can be set. Therefore, it is desirable to select the material of the protecting film 16 in consideration of the excellent function serving as the water protecting film as well as the film formation that is enabled at the relatively low temperature by using the ALD method. Note that the material of the protecting film 16 is a material of each of the high-density layer 16H and the low-density layer 16L configuring the protecting film 16. In these viewpoints, as the material of the protecting film 16, it is preferable to use silicon oxide, silicon nitride, silicon oxynitride, titanium oxide, zirconium oxide, aluminum oxide, aluminum oxynitride or aluminum nitride. The aluminum oxide, the aluminum oxynitride or the aluminum nitride is particularly preferable. Among these materials, the aluminum oxide is most preferable.

In the aluminum oxide film, the aluminum oxynitride film or the aluminum nitride film (particularly the aluminum oxide film among these films), it is easy to form a dense film by using the ALD method even at a low film-forming temperature. Therefore, when the aluminum oxide, the aluminum oxynitride or the aluminum nitride (particularly the aluminum oxide among these compounds) is used as the material of the protecting film 16, the high-density layer 16H having the high density can be easily reliably formed by using the ALD method even at a low film-forming temperature.

As different from the present embodiment, it is assumed that one corresponding to the high-density layer 16H and one corresponding to the low-density layer 16L are made of a different material from each other. In this case, it is necessary to separately prepare a chamber (film-forming container) for forming the one corresponding to the high-density layer 16H and a chamber (film-forming container) for forming the one corresponding to the low-density layer 16L, and therefore, it is necessary to move the process target from one chamber to the other chamber at the middle of the step of forming the protecting film. In this case, it takes long time for forming the protecting film, and a throughput decreases.

On the other hand, in the present embodiment, the high-density layer 16H and the low-density layer 16L of the protecting film 16 have a different density from each other but the same constituent element as each other. That is, all the layers configuring the protecting film 16 have the same constituent element as one another, and are made of the same material as one another. Therefore, all the high-density layers 16H and the low-density layers 16L configuring the protecting film 16 can be consecutively formed in the same chamber (film-forming container) 22 of the same film-forming apparatus 21. That is, the process target 23 is not exposed to ambient air since the process target 23 is arranged inside the chamber 22 of the film-forming apparatus 21 from a start stage of the formation of the protecting film 16 to an end stage of the formation of the protecting film 16, in other words, from a start stage of the formation of the lowermost layer of the protecting film 16 to an end stage of the formation of the uppermost layer of the protecting film 16. In the present embodiment, all the layers configuring the protecting film 16 can be consecutively formed in the same chamber (22), and therefore, the time for forming the protecting film 16 can be shortened, and the throughput can be improved.

<Step of Forming High-Density Layer 16H and Low-Density Layer 16L>

Both the high-density layer 16H and the low-density layer 16L can be formed by using the ALD method, and methods (a first method, a second method and a third method) of separately forming the high-density layer 16H and the low-density layer 16L in the ALD method will be described below.

As described in the section "Film Formation using ALD Method", the ALD method is a method of forming a desirable film over the surface of the process target 23 by performing a plurality of times of a cycle which is made of the first step (source-gas supply step), the second step (purge step), the third step (reaction-gas supply step) and the fourth step (purge step) that are repeated as one cycle. Both the high-density layers 16H and the low-density layers 16L are formed by performing the plurality of times of the cycle which is made of the first step, the second step, the third step and the fourth step that are repeated. As described above, the first step is a step of supplying the source gas into the chamber (film-forming container) 22, the second step is a step of supplying the purge gas into the chamber 22, the third step is a step of supplying the reaction gas into the chamber 22, and the fourth step is a step of supplying the purge gas into the chamber 22.

A type of the source gas for use in the first step is common (the same) between the formation of the high-density layer 16H and the formation of the low-density layer 16L. A type of the purge gas for use in the second step is common (the same) between the formation of the high-density layer 16H and the formation of the low-density layer 16L. A type of the reaction gas for use in the third step is common (the same) between the formation of the high-density layer 16H and the formation of the low-density layer 16L. A type of the purge gas for use in the fourth step is common (the same) between the formation of the high-density layer 16H and the formation of the low-density layer 16L. In the present embodiment, since the type of the source gas for use in the first step is common as well as the reaction gas for use in the third step is common between the formation of the high-density layer 16H and the formation of the low-density layer 16L, the constituent elements of the high-density layer 16H and the low-density layer 16L are the same as each other.

In the present embodiment, the protecting film 16 is formed by using the plasma ALD apparatus (plasma ALD method), and plasma of the reaction gas is generated by a high-frequency power in the third step.

The first method of separately forming the high-density layer 16H and the low-density layer 16L is a method of controlling a level of the high-frequency power of the third step, and will be described first.

In the film formation step using the plasma ALD apparatus, a density of the formed film can be controlled in the third step (reaction-gas supply step), depending on the level of the high-frequency power (in this case, a high-frequency power applied to the upper electrode 25) for generating the plasma of the reaction gas. More specifically, when the high-frequency power in the third step is made large, the density of the formed film tends to be high. When the high-frequency power in the third step is made small, the density of the formed film tends to be low. When the high-frequency power in the third step is made large to some extent or larger, the formed film is nearly the film (layer) having the ideal crystal structure with the less deficiency (holes), and therefore, the density of the formed film is nearly constant. Note that the high-frequency power (in this case, the high-frequency power applied to the upper electrode 25) for generating the plasma of the reaction gas is referred to as "high-frequency power in the third step" or "high-frequency power of the third step".

That is, in the third step, the reaction gas introduced into the chamber 22 is caused to react with source-gas molecules adsorbed on the surface of the process target 23. In order to enhance reactivity (reaction activity) of the reaction gas, the plasma of the reaction gas is generated and is caused to react with the source-gas molecules adsorbed on the surface of the process target 23, so that an atomic layer that is a reaction layer is formed on the surface of the process target 23. When the high-frequency power in the third step is made large, the reactivity between the generated plasma (active species) and the source-gas molecules adsorbed on the surface of the process target 23 is high. Therefore, when the plurality of times of the cycle which is made of the first step, the second step, the third step and the fourth step that are repeated are performed under a large high-frequency power condition in the third step, the formed film is the film having the high density that is nearly the film (layer) having the ideal crystal structure with the less deficiency (holes). On the other hand, when the high-frequency power in the third step is made small, the reactivity between the generated plasma (active species) and the source-gas molecules adsorbed on the surface of the process target 23 is low. Therefore, when the plurality of times of the cycle which is made of the first step, the second step, the third step and the fourth step that are repeated are performed under a small high-frequency power condition in the third step, the formed film undesirably becomes the film with a lot of deficiencies (holes) having the lower density than that of the film (layer) having the ideal crystal structure.

Therefore, as the first method, a level of the high-frequency power (the high-frequency power applied to the upper electrode 25) in the third step for forming the low-density layer 16L is made smaller than a level of the high-frequency power (the high-frequency power applied to the upper electrode 25) in the third step for forming the high-density layer 16H.

In the case of the first method, when the high-density layer 16H is formed, the reaction between the reaction gas (plasma) and the source-gas molecules adsorbed on the surface of the process target 23 is sufficiently caused by the large high-frequency power in the third step. On the other hand, when the low-density layer 16L is formed, the reaction between the reaction gas (plasma) and the source-gas molecules adsorbed on the surface of the process target 23 is purposely suppressed by the small high-frequency power in the third step. In this manner, the density of the low-density layer 16L can be made smaller than the density of the high-density layer 16H.

For example, in the third step for forming the high-density layer 16H (the third step of the step S6H), the high-frequency power applied to the upper electrode 25 is set to 1500 W (watt), and application time of the high-frequency power is set to 1 second. And, in the third step for forming the low-density layer 16L (the third step of the step S6L), the high-frequency power applied to the upper electrode 25 is set to 300 W, and application time of the high-frequency power is set to 1 second. A frequency of the high-frequency power is 13.56 MHz in common between the step S6H and the step S6L. In this manner, the density of the low-density layer 16L formed by performing the plurality of times of the cycle which is made of the first step, the second step, the third step (note that the high-frequency power is 300 W) and the fourth step that are repeated can be made smaller than the density of the high-density layer 16H formed by performing the plurality of times of the cycle which is made of the first step, the second step, the third step (note that the high-frequency power is 1500 W) and the fourth step that are repeated.

Next, the second method of separately forming the high-density layer 16H and the low-density layer 16L is a method of controlling the application time of the high-frequency power in the third step, and will be described.

In the film formation step using the ALD method, the density of the formed film can be also controlled by the application time of the high-frequency power in the third step. More specifically, when the application time of the high-frequency power in the third step is made long, the density of the formed film tends to be high. When the application time of the high-frequency power in the third step is made short, the density of the formed film tends to be low. This is because the reaction between the generated plasma (active species) and the source-gas molecules adsorbed on the surface of the process target 23 is sufficiently caused in the long application time of the high-frequency power in the third step while the reaction between the generated plasma and the source-gas molecules adsorbed on the surface of the process target 23 is not sufficiently caused in the short application time of the high-frequency power in the third step. When the application time of the high-frequency power is made long to some extent, the formed film is nearly the film (layer) having the ideal crystal structure with the less deficiency (holes), and therefore, the density of the formed film is nearly constant.

Therefore, as the second method, the application time of the high-frequency power in the third step for forming the low-density layer 16L is made shorter than the application time of the high-frequency power in the third step for forming the high-density layer 16H.

In the case of the second method, when the high-density layer 16H is formed, the reaction between the reaction gas (plasma) and the source-gas molecules adsorbed on the surface of the process target 23 is sufficiently caused by the long application time of the high-frequency power in the third step. On the other hand, when the low-density layer 16L is formed, the reaction between the reaction gas (plasma) and the source-gas molecules adsorbed on the surface of the process target 23 is purposely suppressed by the short application time of the high-frequency power in the third step. In this manner, the density of the low-density layer 16L can be made smaller than the density of the high-density layer 16H.

For example, in the third step for forming the high-density layer 16H (the third step of the step S6H), the high-frequency power applied to the upper electrode 25 is set to 1500 W, and the application time of the high-frequency power is set to 1 second. And, in the third step for forming the low-density layer 16L (the third step of the step S6L), the high-frequency power applied to the upper electrode 25 is set to 1500 W, and the application time of the high-frequency power is set to 0.1 second. The frequency of the high-frequency power is 13.56 MHz in common between the step S6H and the step S6L. In this manner, the density of the low-density layer 16L formed by performing the plurality of times of the cycle which is made of the first step, the second step, the third step (note that the application time of the high-frequency power is 0.1 second) and the fourth step that are repeated can be made smaller than the density of the high-density layer 16H formed by performing the plurality of times of the cycle which is made of the first step, the second step, the third step (the application time of the high-frequency power is 1 second) and the fourth step that are repeated.

Next, the third method of separately forming the high-density layer 16H and the low-density layer 16L is a method of controlling the frequency of the high-frequency power in the third step, and will be described.

In the film formation step using the ALD method, the density of the formed film can be also controlled by the frequency of the high-frequency power in the third step. More specifically, when the frequency of the high-frequency power in the third step is made high, the density of the formed film tends to be high. When the frequency of the high-frequency power in the third step is made low, the density of the formed film tends to be low. This is because the reaction between the generated plasma (active species) and the source-gas molecules adsorbed on the surface of the process target 23 is sufficiently caused in the high frequency of the high-frequency power in the third step while the reaction between the generated plasma and the source-gas molecules adsorbed on the surface of the process target 23 is not sufficiently caused in the low frequency of the high-frequency power in the third step. When the frequency of the high-frequency power in the third step is made high to some extent, the formed film is nearly the film (layer) having the ideal crystal structure with the less deficiency (holes), and therefore, the density of the formed film is nearly constant.

Therefore, as the third method, the frequency of the high-frequency power in the third step for forming the low-density layer 16L is made lower than the frequency of the high-frequency power in the third step for forming the high-density layer 16H.

In the case of the third method, when the high-density layer 16H is formed, the reaction between the reaction gas (plasma) and the source-gas molecules adsorbed on the surface of the process target 23 is sufficiently caused by the high frequency of the high-frequency power in the third step. On the other hand, when the low-density layer 16L is formed, the reaction between the reaction gas (plasma) and the source-gas molecules adsorbed on the surface of the process target 23 is purposely suppressed by the low frequency of the high-frequency power in the third step. In this manner, the density of the low-density layer 16L can be made smaller than the density of the high-density layer 16H.

As one example, in the third step for forming the high-density layer 16H (the third step of the step S6H), the frequency of the high-frequency power applied to the upper electrode 25 can be set to 27.21 MHz. And, in the third step for forming the low-density layer 16L (the third step of the step S6L), the frequency of the high-frequency power applied to the upper electrode 25 can be set to 13.56 MHz.

When the third method of the first, second and third methods is applied, it is necessary to provide the film-forming apparatus 21 with a total of two high-frequency power supplies that are a high-frequency power supply for supplying the high-frequency power in the third step for forming the high-density layer 16H and a high-frequency power supply for supplying the high-frequency power in the third step for forming the low-density layer 16L.

On the other hand, in the first and second methods, the frequency of the high-frequency power in the third step for forming the high-density layer 16H and the frequency of the high-frequency power in the third step for forming the low-density layer 16L can be the same as each other. Therefore, in the first and second methods, the high-frequency power supply for supplying the high-frequency power in the third step for forming the high-density layer 16H and the high-frequency power supply for supplying the high-frequency power in the third step for forming the low-density layer 16L can be shared, and therefore, it is only necessary to provide the film-forming apparatus 21 with one high-frequency power supply 29. Therefore, the structure of the film-forming apparatus 21 can be simplified, and a manufacturing cost of the film-forming apparatus 21 can be suppressed, and thus, a manufacturing cost of the organic EL display apparatus can be suppressed.

A method that is the easiest to secure a difference between the density of the high-density layer 16H and the density of the low-density layer 16L is the first method among the first, second and third methods. Therefore, as the method of separately forming the high-density layer 16H and the low-density layer 16L, it is particularly preferable to apply the first method. The first method is applied to make the level of the high-frequency power in the third step for forming the low-density layer 16L to be smaller than the level of the high-frequency power in the third step for forming the high-density layer 16H, so that the difference between the density of the high-density layer 16H and the density of the low-density layer 16L can be easily reliably secured, and the density of the low-density layer 16L can be easily reliably smaller than the density of the high-density layer 16H.

As a modified example, any method of the first, second and third methods can be combined. For example, the first method and the second method can be combined. In this case, the level of the high-frequency power in the third step for forming the low-density layer 16L is made smaller than the level of the high-frequency power in the third step for forming the high-density layer 16H, and the application time of the high-frequency power in the third step for forming the low-density layer 16L is made shorter than the application time of the high-frequency power in the third step for forming the high-density layer 16H. Also in the case of the combination of the first method and the second method, the high-frequency power supply for supplying the high-frequency power in the third step for forming the high-density layer 16H and the high-frequency power supply for supplying the high-frequency power in the third step for forming the low-density layer 16L can be shared.

As one example in a case of the combination of the first method and the second method, the high-frequency power applied to the upper electrode 25 is set to 1500 W and the application time of the high-frequency power is set to 1 second in the third step for forming the high-density layer 16H while the high-frequency power applied to the upper electrode 25 is set to 300 W and the application time of the high-frequency power is set to 0.1 second in the third step for forming the low-density layer 16L. The frequency of the high-frequency power is set to be the same between the third step for forming the high-density layer 16H and the third step for forming the low-density layer 16L. In this manner, the density of the low-density layer 16L formed by performing the plurality of times of the cycle which is made of the first step, the second step, the third step and the fourth step that are repeated can be reliably lower than the density of the high-density layer 16H formed by performing the plurality of times of the cycle which is made of the first step, the second step, the third step and the fourth step that are repeated.

As described above, the protecting film for use in the organic EL display apparatus using the flexible substrate requires the barrier performance against the water and the resistance property against the bending. Accordingly, in the present embodiment, the water barrier layer (in this case, the high-density layers 16H) and the stress moderating layer (in this case, the low-density layers 16L) are alternately layered to form the protecting film (16), so that the resistance property of the protecting film against the bending can be improved while the waterproof function of the protecting film is secured. The constituent element of the water barrier layer (in this case, the high-density layers 16H) and the constituent element of the stress moderating layer (in this case, the low-density layers 16L) are the same as each other, and the densities of them are controlled, so that the water barrier layer (in this case, the high-density layers 16H) and the stress moderating layer (in this case, the low-density layers 16L) are separately formed. In this manner, the time taken for the formation of the protecting film (16) can be shortened, and the throughput can be improved. The problem resulting from the dropping off of the particles 31 can be prevented since the protecting film (16) is formed by using the ALD method, and the density of the protecting film can be controlled so that the water barrier layer (in this case, the high-density layers 16H) and the stress moderating layer (in this case, the low-density layers 16L) are easily reliably separately formed since the high-frequency power (the high-frequency power in the third step) for generating the plasma is controlled by using the plasm ALD method as the ALD method.

In the foregoing, the invention made by the present inventors has been concretely described on the basis of the embodiments. However, it is needless to say that the present invention is not limited to the foregoing embodiments, and various alterations can be made within the scope of the present invention.

EXPLANATION OF REFERENCE CHARACTERS 1 display apparatus
2 display unit
3 circuit unit
9 glass substrate
10 substrate
11 substrate
12 passivation film
13, 15 electrode layer
13a, 15a electrode
14 organic layer
16, 32, 33, 116, 216 protecting film
16H high-density layer
16L low-density layer
17 resin film
21 film-forming apparatus
22 chamber 23 process target
24 stage
25 upper electrode
26 exhaust unit
27 gas inlet
28 gas outlet
29 high-frequency power supply
31 particle
32, 33 protecting film
T1, T2 thickness

The invention claimed is:

1. A display apparatus comprising:
a flexible substrate;
an organic EL element formed over the flexible substrate; and
a protecting film made of an inorganic insulating material formed so as to cover the organic EL element,
wherein the protecting film has a layered structure made of one or more high-density layers and one or more low-density layers having a lower density than a density of the high-density layer so that the low-density layer and the high-density layer are alternately layered so as to be in contact with each other,
the one or more high-density layers and the one or more low-density layers configuring the protecting film have the same constituent element as each other, and
the uppermost layer of the layered structure is made of the low-density layer.

2. The display apparatus according to claim 1,
wherein each of the one or more high-density layers and the one or more low-density layers configuring the protecting film is made of a silicon oxide layer, a silicon nitride layer, a silicon oxynitride layer, a titanium oxide layer, a zirconium oxide layer, an aluminum oxide layer, an aluminum oxynitride layer or an aluminum nitride layer, that is formed by using an ALD method.

3. The display apparatus according to claim 1,
wherein each of the one or more high-density layers and the one or more low-density layers configuring the protecting film is made of an aluminum oxide layer, an aluminum oxynitride layer or an aluminum nitride layer, that is formed by using an ALD method.

4. The display apparatus according to claim 1,
wherein the lowermost layer of the layered structure is made of the low-density layer.

5. The display apparatus according to claim 1,
wherein the layered structure includes a plurality of the high-density layers and the low-density layer intermediating between the plurality of the high-density layers.

6. The display apparatus according to claim 1,
wherein a thickness of the high-density layer is larger than a thickness of the low-density layer.

7. The display apparatus according to claim 6,
wherein the thickness of the low-density layer is equal to or larger than 2 nm.

8. The display apparatus according to claim 1,
wherein a density of the low-density layer is equal to or lower than 95% of a density of the high-density layer.

9. The display apparatus according to claim 8,
wherein the density of the low-density layer is equal to or higher than 80% of the density of the high-density layer.

10. A method of manufacturing a display apparatus having an organic EL element, comprising the steps of:
(a) forming the organic EL element over a flexible substrate; and
(b) forming a protecting film made of an inorganic insulating material so as to cover the organic EL element by using an ALD method,
wherein, in the step (b), the protecting film is formed by alternately performing the steps of:
(c) forming a high-density layer by using an ALD method; and
(d) before or after the step (c), by using an ALD method, forming a low-density layer that has the same constituent element as the high-density layer and has a lower density than the high-density layer,
wherein the protecting film has a layered structure made of one or more high-density layers and one or more low-density layers so that the low-density layer and the high-density layer are alternately layered so as to be in contact with each other,
wherein, in the step (b), the protecting film is formed in a state in which the flexible substrate having the organic EL element formed thereon is arranged inside film-forming chamber of a film-forming apparatus,
in the step (c), the high-density layer is formed by performing a plurality of times of a cycle that are repeated, each cycle comprising the steps of:
(c1) supplying a first source gas into the film-forming chamber;
(c2) supplying a first purge gas into the film-forming chamber after the step (c1);
(c3) supplying a first reaction gas into the film-forming chamber after the step (c2); and
(c4) supplying a second purge gas into the film-forming chamber after the step (c3),
in the step (d), the low-density layer is formed by performing a plurality of times of a cycle that are repeated, each cycle comprising the steps of:
(d1) supplying a second source gas into the film-forming chamber;
(d2) supplying a third purge gas into the film-forming chamber after the step (d1);
(d3) supplying a second reaction gas into the film-forming chamber after the step (d2); and
(d4) supplying a fourth purge gas into the film-forming chamber after the step (d3),
the first source gas and the second source gas have the same gas type,
the first reaction gas and the second reaction gas have the same gas type,
in the step (c3), plasma of the first reaction gas is generated a first high-frequency power,
in the step (d3), plasma of the second reaction gas is generated by a second high-frequency power, and
the second high-frequency power is smaller than the first high-frequency power.

11. The method of manufacturing the display apparatus according to claim 10,
wherein each of the high-density layer formed in the step (c) and the low-density layer formed in the step (d) is made of silicon oxide, silicon nitride, silicon oxynitride, titanium oxide, zirconium oxide, aluminum oxide, aluminum oxynitride or aluminum nitride.

12. The method of manufacturing the display apparatus according to claim 10,
wherein each of the high-density layer formed in the step (c) and the low-density layer formed in the step (d) is made of aluminum oxide, aluminum oxynitride or aluminum nitride.

13. The method of manufacturing the display apparatus according to claim 10, wherein application time of the second high-frequency power in the step (d3) is shorter than application time of the first high-frequency power in the step (c3).

14. The method of manufacturing the display apparatus according to claim 10,
wherein a frequency of the second high-frequency power is lower than a frequency of the first high-frequency power.

15. The method of manufacturing the display apparatus according to claim 10,
wherein a density of the low-density layer formed in the step (d) is equal to or lower than 95% of a density of the high-density layer formed in the step (c).

16. The method of manufacturing the display apparatus according to claim 15,
wherein the density of the low-density layer formed in the step (d) is equal to or higher than 80% of the density of the high-density layer formed in the step (c).

17. The method of manufacturing the display apparatus according to claim 10,
wherein a thickness of the high-density layer formed in the step (c) is larger than a thickness of the low-density layer formed in the step (d).

18. The method of manufacturing the display apparatus according to claim 17,
wherein the thickness of the low-density layer formed in the step (d) is equal to or larger than 2 nm.

19. A method of manufacturing a display apparatus having an organic EL element, comprising the steps of:
(a) forming the organic EL element over a flexible substrate; and
(b) forming a protecting film made of an inorganic insulating material so as to cover the organic EL element by using an ALD method,
wherein, in the step (b), the protecting film is formed by alternately performing the steps of:
(c) forming a high-density layer by using an ALD method; and
(d) before or after the step (c), by using an ALD method, forming a low-density layer that has the same constituent element as the high-density layer and has a lower density than the high-density layer,
wherein the protecting film has a layered structure made of one or more high-density layers and one or more low-density layers so that the low-density layer and the high-density layer are alternately layered so as to be in contact with each other,
wherein, in the step (b), the protecting film is formed in a state in which the flexible substrate having the organic EL element formed thereon is arranged inside a film-forming chamber of a film-forming apparatus,
in the step (c), the high-density layer is formed by performing a plurality of times of a cycle that are repeated, each cycle comprising the steps of:
(c1) supplying a first source gas into the film-forming chamber;
(c2) supplying a first purge gas into the film-forming chamber after the step (c1);
(c3) supplying a first reaction gas into the film-forming chamber after the step (c2); and
(c4) supplying a second purge gas into the film-forming chamber after the step (c3),
in the step (d), the low-density layer is formed by performing a plurality of times of a cycle that are repeated, each cycle comprising the steps of:
(d1) supplying a second source gas into the film-forming chamber;
(d2) supplying a third purge gas into the film-forming chamber after the step (d1);
(d3) supplying a second reaction gas into the film-forming chamber after the step (d2); and
(d4) supplying a fourth purge gas into the film-forming chamber after the step (d3),
the first source gas and the second source gas have the same gas type,
the first reaction gas and the second reaction gas have the same gas type,
in the step (c3), plasma of the first reaction gas is generated by a first high-frequency power,
in the step (d3), plasma of the second reaction gas is generated by a second high-frequency power, and
application time of the second high-frequency power in the step (d3) is shorter than application time of the first high-frequency power in the step (c3).

20. A method of manufacturing a display apparatus having an organic EL element, comprising the steps of:
(a) forming the organic EL element over a flexible substrate; and
(b) forming a protecting film made of an inorganic insulating material so as to cover the organic EL element by using an ALD method,
wherein, in the step (b), the protecting film is formed by alternately performing the steps of:
(c) forming a high-density layer by using an ALD method; and
(d) before or after the step (c), by using an ALD method, forming a low-density layer that has the same constituent element as the high-density layer and has a lower density than the high-density layer,
wherein the protecting film has a layered structure made of one or more high-density layers and one or more low-density layers so that the low-density layer and the high-density layer are alternately layered so as to be in contact with each other,
wherein, in the step (b), the protecting film is formed in a state in which the flexible substrate having the organic EL element formed thereon is arranged inside a film-forming chamber of a film-forming apparatus,
in the step (c), the high-density layer is formed by performing a plurality of times of a cycle that are repeated, each cycle comprising the steps of:
(c1) supplying a first source gas into the film-forming chamber;
(c2) supplying a first purge gas into the film-forming chamber after the step (c1);
(c3) supplying a first reaction gas into the film-forming chamber after the step (c2); and
(c4) supplying a second purge gas into the film-forming chamber after the step (c3),
in the step (d), the low-density layer is formed by performing a plurality of times of a cycle that are repeated, each cycle comprising the steps of:
(d1) supplying a second source gas into the film-forming chamber;
(d2) supplying a third purge gas into the film-forming chamber after the step (d1);
(d3) supplying a second reaction gas into the film-forming chamber after the step (d2); and
(d4) supplying a fourth purge gas into the film-forming chamber after the step (d3),
the first source gas and the second source gas have the same gas type,
the first reaction gas and the second reaction gas have the same gas type, in the step (c3), plasma of the first reaction gas is generated by a first high-frequency power,
in the step (d3), plasma of the second reaction gas is generated by a second high-frequency power, and
a frequency of the second high-frequency power is lower than a frequency of the first high-frequency power.

* * * * *